United States Patent
Kimura

[11] Patent Number: 6,028,877
[45] Date of Patent: Feb. 22, 2000

[54] GALLIUM NITRIDE BASED SEMICONDUCTOR LASER WITH AN IMPROVED ALUMINUM GALLIUM NITRIDE CLADDING LAYER DISPOSED BETWEEN AN ACTIVE REGION AND A SUBSTRATE

[75] Inventor: Akitaka Kimura, Tokyo, Japan

[73] Assignee: NEC Corporation, Tokyo, Japan

[21] Appl. No.: 08/989,858

[22] Filed: Dec. 12, 1997

[30] Foreign Application Priority Data

Dec. 13, 1996 [JP] Japan ................................ 8-333172

[51] Int. Cl.⁷ ................................................. H01S 3/19
[52] U.S. Cl. ................................................. 372/46; 372/45
[58] Field of Search ..................... 372/45, 46; 257/13, 257/14, 22, 103

[56] References Cited

U.S. PATENT DOCUMENTS 5,617,438  4/1997  Hatano et al. ............................ 372/45
5,866,440  2/1999  Hata ....................................... 372/46

OTHER PUBLICATIONS

Shuji Nakamura et al., "Ridge–geometry InGaN multi–quantum–well–structure laser diodes", pp. 1477–1479, American Institute of Physics, Appl. Phys. Lett., vol. 69, No. 10, Sep. 2, 1996.

*Primary Examiner*—James W. Davie
*Attorney, Agent, or Firm*—Young & Thompson

[57] ABSTRACT

In accordance with the first present invention, a cladding layer is provided between a gallium nitride based semiconductor active region and a substrate made of a material having a refraction index which is not lager than a refraction index of gallium nitride. The cladding layer includes at least one $Al_xGa_{1-x}N$ layer. An averaged value of the index "x" of aluminum of the above at least one $Al_xGa_{1-x}N$ layer is in the range of not less than 0.01 to less than 0.05 and a total thickness of the above at least one $Al_xGa_{1-x}N$ layer is not less than 0.7 micrometers as well as the cladding layer has an averaged refractive index which is lower than the refractive index of gallium nitride.

84 Claims, 15 Drawing Sheets

| InGaN Active Region | Single $Al_xGa_{1-x}N$ cladding layer (Thickness "d" $\geq 0.7 \mu m$) <br><br> Al index "x" is constant ($0.01 \leq$ "x" $< 0.05$) <br><br><br> "x" $=0.04$; "d" $=1\mu m$ | GaN | Substrate |
|---|---|---|---|

| InGaN Active Region | Single AlxGa1−xN cladding layer (Thickness "d" ≧ 0.7 μm)<br><br>A1 index "x" is constant (0.01 ≦ "x" < 0.05)<br><br><br>"x" =0.02; "d"=1.5 μm | GaN | Substrate |
|---|---|---|---|

6,028,877

GALLIUM NITRIDE BASED SEMICONDUCTOR LASER WITH AN IMPROVED ALUMINUM GALLIUM NITRIDE CLADDING LAYER DISPOSED BETWEEN AN ACTIVE REGION AND A SUBSTRATE

BACKGROUND OF THE INVENTION

The present invention relates to a gallium nitride based semiconductor laser device, and more particularly to a gallium nitride based semiconductor laser device with an optimized optical confinement structure.

Gallium nitride has a larger energy band gap than other typical compound semiconductors such as indium phosphide and gallium arsenide, for which reason gallium nitride based compound semiconductor is attractive for application to a light emitting device such as semiconductor laser for emitting a light having a wavelength in the range of green to ultraviolet ray.

Six cases of gallium nitride based semiconductor lasers have been reported. In every cases, the active layer comprises a single or multiple quantum well structure of $In_xGa_{1-x}N$ quantum well layers and $In_xGa_{1-x}N$ barrier layers having a larger energy band gap than an energy band gap of the $In_xGa_{1-x}N$ quantum well layers. Optical guide layers are made of gallium nitride. Further, an $Al_xGa_{1-x}N$ layer is provided on the $In_xGa_{1-x}N$ active layer for prevention of dissociation and evaporation of indium from the $In_xGa_{1-x}N$ active layer. The active region comprises the active layer, the optical guide layer and the $Al_xGa_{1-x}N$ layer. Cladding layers are provided to sandwich the active region. The cladding layers are made of $Al_xGa_{1-x}N$ ($0.05 \leq x < 0.15$) and has a thickness of not more than 0.5 micrometers.

FIG. 1 is a fragmentary cross sectional elevation view illustrative of a gallium nitride based semiconductor laser device in a first prior art. The conventional gallium nitride based semiconductor laser device is formed on a (0001)-face of a sapphire substrate 101. An undoped GaN buffer layer 102 is provided on the (0001)-face of a sapphire substrate 101. The undoped GaN buffer layer 102 has a thickness of 300 Å. An n-type GaN contact layer 103 is provided on the undoped GaN buffer layer 102. The n-type GaN contact layer 103 is doped with Si. The n-type GaN contact layer 103 has a thickness of 3 μm. An n-type $In_{0.1}Ga_{0.9}N$ layer 104 is provided on the n-type GaN contact layer 103. The n-type $In_{0.1}Ga_{0.9}N$ layer 104 is doped with Si. The n-type $In_{0.1}Ga_{0.9}N$ layer 104 has a thickness of 0.1 μm. An n-type $Al_{0.15}Ga_{0.85}N$ cladding layer 405 is provided on the n-type $In_{0.1}Ga_{0.9}N$ layer 104. The n-type $Al_{0.15}Ga_{0.85}N$ cladding layer 405 is doped with Si. The n-type $Al_{0.15}Ga_{0.85}N$ cladding layer 405 has a thickness of 0.4 μm. An n-type GaN optical guide layer 106 is provided on the n-type $Al_{0.15}Ga_{0.85}N$ cladding layer 405. The n-type GaN optical guide layer 106 is doped with Si. The n-type GaN optical guide layer 106 has a thickness of 0.1 μm. A multiple quantum well active layer 107 is provided on the n-type GaN optical guide layer 106. The multiple quantum well active layer 107 comprises 26 periods of 25 Å-thick undoped $In_{0.2}Ga_{0.8}N$ quantum well layers and 50 Å-thick undoped $In_{0.50}Ga_{0.95}N$ barrier layers. A p-type $Al_{0.2}Ga_{0.8}N$ layer 108 is provided on the multiple quantum well active layer 107. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppressing dissociation and evaporation of indium from the indium gallium nitride layers of the multiple quantum well active layer 107. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 μm. A p-type $Al_{0.15}Ga_{0.85}N$ cladding layer 110 is provided on the p-type GaN optical guide layer 109. The p-type $Al_{0.15}Ga_{0.85}N$ cladding layer 110 is doped with Mg. The p-type $Al_{0.15}Ga_{0.85}N$ cladding layer 110 has a thickness of 0.4 μm. A p-type GaN contact layer 111 is provided on the p-type $Al_{0.15}Ga_{0.85}N$ cladding layer 110. The p-type GaN contact layer 111 is doped with Mg. The p-type GaN contact layer 111 has a thickness of 0.5 μm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises a titanium layer and an aluminum layer. The above gallium nitride based semiconductor laser is disclosed in Japan Journal of Applied Physics 35 (1996) L74.

FIG. 2 is a fragmentary cross sectional elevation view illustrative of a gallium nitride based semiconductor laser device in a second prior art. The conventional gallium nitride based semiconductor laser device is formed on a (11-20)-face of a sapphire substrate 501. An undoped GaN buffer layer 102 is provided on the (11-20)-face of a sapphire substrate 501. The undoped GaN buffer layer 102 has a thickness of 500 Å. An n-type GaN contact layer 103 is provided on the undoped GaN buffer layer 102. The n-type GaN contact layer 103 is doped with Si. The n-type GaN contact layer 103 has a thickness of 3 μm. An n-type $In_{0.1}Ga_{0.9}N$ layer 104 is provided on the n-type GaN contact layer 103. The n-type $In_{0.1}Ga_{0.9}N$ layer 104 is doped with Si. The n-type $In_{0.1}Ga_{0.9}N$ layer 104 has a thickness of 0.1 μm. An n-type $Al_{0.12}Ga_{0.88}N$ cladding layer 505 is provided on the n-type $In_{0.1}Ga_{0.9}N$ layer 104. The n-type $Al_{0.12}Ga_{0.88}N$ cladding layer 505 is doped with Si- The n-type $Al_{0.12}Ga_{0.88}N$ cladding layer 505 has a thickness of 0.4 μm. An n-type GaN optical guide layer 106 is provided on the n-type $Al_{0.12}Ga_{0.88}N$ cladding layer 505. The n-type GaN optical guide layer 106 is doped with Si. The n-type GaN optical guide layer 106 has a thickness of 0.1 μm. A multiple quantum well active layer 507 is provided on the n-type GaN optical guide layer 106. The multiple quantum well active layer 507 comprises 20 periods of 25 Å-thick undoped $In_{0.2}Ga_{0.8}N$ quantum well layers and 50 Å-thick undoped $In_{0.05}Ga_{0.95}N$ barrier layers. A p-type $Al_{0.2}Ga_{0.8}N$ layer 108 is provided on the multiple quantum well active layer 507. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppressing dissociation and evaporation of indium from the indium gallium nitride layers of the multiple quantum well active layer 507. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 μm. A p-type $Al_{0.12}Ga_{0.88}N$ cladding layer 510 is provided on the p-type GaN optical guide layer 109. The p-type $Al_{0.12}Ga_{0.88}N$ cladding layer 510 is doped with Mg. The p-type $Al_{0.15}Ga_{0.85}N$ cladding layer 110 has a thickness of 0.4 μm. A p-type GaN contact layer 111 is provided on the p-type $Al_{0.12}Ga_{0.88}N$ cladding layer 510. The p-type GaN contact layer 111 is doped with Mg. The p-type GaN contact layer 111 has a thickness of 0.5 μm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises a titanium layer and an aluminum layer. The above gallium nitride based semiconductor laser is disclosed in Japan Journal of Applied Physics 35 (1996) L217.

FIG. 3 is a fragmentary cross sectional elevation view illustrative of a gallium nitride based semiconductor laser device in a third prior art. The conventional gallium nitride based semiconductor laser device is formed on a (111)-face of a $MgAl_2O_4$ substrate 601. An undoped GaN buffer layer 102 is provided on the (111)-face of a $MgAl_2O_4$ substrate 601. The undoped GaN buffer layer 102 has a thickness of 300 Å. An n-type GaN contact layer 103 is provided on the undoped GaN buffer layer 102. The n-type GaN contact layer 103 is doped with Si. The n-type GaN contact layer 103 has a thickness of 3 µm. An n-type $In_{0.1}Ga_{0.9}N$ layer 104 is provided on the n-type GaN contact layer 103. The n-type $In_{0.1}Ga_{0.9}N$ layer 104 is doped with Si. The n-type $In_{0.1}Ga_{0.9}N$ layer 104 has a thickness of 0.1 µm. An n-type $Al_{0.12}Ga_{0.88}N$ cladding layer 505 is provided on the n-type $In_{0.1}Ga_{0.9}N$ layer 104. The n-type $Al_{0.12}Ga_{0.88}N$ cladding layer 505 is doped with Si. The n-type $Al_{0.12}Ga_{0.88}N$ cladding layer 505 has a thickness of 0.4 µm. An n-type GaN optical guide layer 106 is provided on the n-type $Al_{0.12}Ga_{0.88}N$ cladding layer 505. The n-type GaN optical guide layer 106 is doped with Si. The n-type GaN optical guide layer 106 has a thickness of 0.07 µm. A multiple quantum well active layer 607 is provided on the n-type GaN optical guide layer 106. The multiple quantum well active layer 607 comprises 20 periods of 25 Å-thick undoped $In_{0.15}Ga_{0.85}N$ quantum well layers and 50 Å-thick undoped $In_{0.05}Ga_{0.95}N$ barrier layers. A p-type $Al_{0.2}Ga_{0.8}N$ layer 108 is provided on the multiple quantum well active layer 507. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppressing dissociation and evaporation of indium from the indium gallium nitride layers of the multiple quantum well active layer 607. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 µm. A p-type $Al_{0.12}Ga_{0.88}N$ cladding layer 510 is provided on the p-type GaN optical guide layer 109. The p-type $Al_{0.12}Ga_{0.88}N$ cladding layer 510 is doped with Mg. The p-type $Al_{0.12}Ga_{0.88}N$ cladding layer 510 has a thickness of 0.4 µm. A p-type GaN contact layer 111 is provided on the p-type $Al_{0.12}Ga_{0.88}N$ cladding layer 510. The p-type GaN contact layer 111 is doped with Mg. The p-type GaN contact layer 111 has a thickness of 0.4 µm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises a titanium layer and an aluminum layer. The above gallium nitride based semiconductor laser is disclosed in Japan Journal of Applied Physics 68 (1996) 2405.

FIG. 4 is a fragmentary cross sectional elevation view illustrative of a gallium nitride based semiconductor laser device in a fourth prior art. The conventional gallium nitride based semiconductor laser device is formed on a (0001)-face of a sapphire substrate 101. An undoped AlN buffer layer 702 is provided on the (111)-face of the sapphire substrate 101. The undoped AlN buffer layer 702 has a thickness of 300 Å. An n-type GaN contact layer 103 is provided on the undoped AlN buffer layer 702. The n-type GaN contact layer 103 is doped with Si. The n-type GaN contact layer 103 has a thickness of 3 µm. An n-type $Al_{0.15}Ga_{0.85}N$ cladding layer 405 is provided on the n-type GaN contact layer 103. The n-type $Al_{0.15}Ga_{0.85}N$ cladding layer 405 is doped with Si. The n-type $Al_{0.15}Ga_{0.85}N$ cladding layer 405 has a thickness of 0.5 µm. An n-type GaN optical guide layer 106 is provided on the n-type $Al_{0.15}Ga_{0.85}N$ cladding layer 405. The n-type GaN optical guide layer 106 is doped with Si. The n-type GaN optical guide layer 106 has a thickness of 0.1 µm. A single quantum well active layer 707 is provided on the n-type GaN optical guide layer 106. The single quantum well active layer 707 comprises a 15 Å-thick undoped $In_{0.1}Ga_{0.9}N$ quantum well layer. A p-type $Al_{0.2}Ga_{0.8}N$ layer 108 is provided on the single quantum well active layer 707. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppressing dissociation and evaporation of indium from the indium gallium nitride layers of the single quantum well active layer 707. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 µm. A p-type $Al_{0.15}Ga_{0.85}N$ cladding layer 110 is provided on the p-type GaN optical guide layer 109. The p-type $Al_{0.15}Ga_{0.85}N$ cladding layer 110 is doped with Mg. The p-type $Al_{0.15}Ga_{0.85}N$ cladding layer 110 has a thickness of 0.5 µm. A p-type GaN contact layer 111 is provided on the p-type $Al_{0.15}Ga_{0.85}N$ cladding layer 110. The p-type GaN contact layer 111 is doped with Mg. The p-type GaN contact layer 111 has a thickness of 0.8 µm. A p-electrode 112 is provided between silicon oxide layers 714 provided on the p-type GaN contact layer 111. The p-electrode 112 comprises laminations of a nickel layer and a gold layer. An n-electrode 113 is provided on a part of the n-type GaN contact layer 103 The n-electrode 113 comprises a titanium layer and an aluminum layer. The above gallium nitride based semiconductor laser is disclosed in Electric Letters 32 (1996) 1105.

FIG. 5 is a fragmentary cross sectional elevation view illustrative of a gallium nitride based semiconductor laser device in a fifth prior art. The conventional gallium nitride based semiconductor laser device is formed on a (11-20)-face of a sapphire substrate 601. An undoped GaN buffer layer 102 is provided on the (11-20)-face of the sapphire substrate 601. The undoped GaN buffer layer 102 has a thickness of 300 Å. An n-type GaN contact layer 103 is provided on the undoped GaN buffer layer 102. The n-type GaN contact layer 103 is doped with Si. The n-type GaN contact layer 103 has a thickness of 3 µm. An n-type $In_{0.05}Ga_{0.95}N$ layer 804 is provided on the n-type GaN contact layer 103. The n-type $In_{0.05}Ga_{0.95}N$ layer 804 is doped with Si. The n-type $In_{0.05}Ga_{0.95}N$ layer 804 has a thickness of 0.1 µm. An n-type $Al_{0.07}Ga_{0.93}N$ cladding layer 805 is provided on the n-type $In_{0.05}Ga_{0.95}N$ layer 804. The n-type $Al_{0.07}Ga_{0.93}N$ cladding layer 805 is doped with Si. The n-type $Al_{0.07}Ga_{0.93}N$ cladding layer 805 has a thickness of 0.4 µm. An n-type GaN optical guide layer 106 is provided on the n-type $Al_{0.07}Ga_{0.93}N$ cladding layer 805. The n-type GaN optical guide layer 106 is doped with Si. The n-type GaN optical guide layer 106 has a thickness of 0.1 µm. A multiple quantum well active layer 807 is provided on the n-type GaN optical guide layer 106. The multiple quantum well active layer 807 comprises 7 periods of 25 Å-thick undoped $In_{0.2}Ga_{0.8}N$ quantum well layers and 50 Å-thick undoped $In_{0.05}Ga_{0.95}N$ barrier layers. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppressing dissociation and evaporation of indium from the indium gallium nitride layers of the multiple quantum well active layer 807. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 µm. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $Al_{0.07}Ga_{0.93}N$ cladding layer 810 has a thickness of 0.4 µm. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 µm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises a titanium layer and an aluminum layer. The above gallium nitride based semiconductor laser is disclosed in Extended Abstracts of 1996 International Conference on Solid State Device and Materials, Yokohama, 1996, pp. 67–69.

FIG. 6 is a fragmentary cross sectional elevation view illustrative of a gallium nitride based semiconductor laser device in a sixth prior art. The conventional gallium nitride based semiconductor laser device is formed on a (11-20)-face of a sapphire substrate 601. An undoped GaN buffer layer 102 is provided on the (11-20)-face of the sapphire substrate 601. The undoped GaN buffer layer 102 has a thickness of 300 Å. An n-type GaN contact layer 103 is provided on the undoped GaN buffer layer 102. The n-type GaN contact layer 103 is doped with Si. The n-type GaN contact layer 103 has a thickness of 3 µm. An n-type $In_{0.05}Ga_{0.95}N$ layer 804 is provided on the n-type GaN contact layer 103. The n-type $In_{0.05}Ga_{0.95}N$ layer 804 is doped with Si. The n-type $In_{0.05}Ga_{0.95}N$ layer 804 has a thickness of 0.1 µm. An n-type $Al_{0.05}Ga_{0.95}N$ cladding layer 905 is provided on the n-type $In_{0.05}Ga_{0.95}N$ layer 804. The n-type $Al_{0.05}Ga_{0.95}N$ cladding layer 905 is doped with Si. The n-type $Al_{0.05}Ga_{0.95}N$ cladding layer 905 has a thickness of 0.5 µm. An n-type GaN optical guide layer 106 is provided on the n-type $Al_{0.05}Ga_{0.95}N$ cladding layer 905. The n-type GaN optical guide layer 106 is doped with Si. The n-type GaN optical guide layer 106 has a thickness of 0.1 µm. A multiple quantum well active layer 807 is provided on the n-type GaN optical guide layer 106. The multiple quantum well active layer 807 comprises 7 periods of 25 Å-thick undoped $In_{0.2}Ga_{0.8}N$ quantum well layers and 50 µ-thick undoped $In_{0.05}Ga_{0.95}N$ barrier layers. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppressing dissociation and evaporation of indium from the indium gallium nitride layers of the multiple quantum well active layer 807. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 µm. A p-type $Al_{0.05}Ga_{0.95}N$ cladding layer 910 is provided on the p-type GaN optical guide layer 109. The p-type $Al_{0.05}Ga_{0.95}N$ cladding layer 910 is doped with Mg. The p-type $Al_{0.05}Ga_{0.95}N$ cladding layer 910 has a thickness of 0.5 µm. A p-type GaN contact layer 111 is provided on the p-type $Al_{0.05}Ga_{0.95}N$ cladding layer 910. The p-type GaN contact layer 111 is doped with Mg. The p-type GaN contact layer 111 has a thickness of 0.2 µm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises a titanium layer and an aluminum layer. The above gallium nitride based semiconductor laser is disclosed in Applied Physics Letters 69, 1996, 1477.

Generally, the gallium nitride based semiconductor laser has a larger gain in transverse electric mode than that in transverse magnetic mode. The emission is made in the transverse electric mode of such an order that the optical confinement coefficient into the gain region becomes maximum.

FIG. 7 is a graph illustrative of optical intensity and refractive index versus a depth from the surface of the semiconductor layer in a gallium nitride based semiconductor laser device of FIG. 4. Individual refractive indexes of every layers in the form of the laser are shown. The optical intensity represents the distribution of light which is calculated in the tenth ordered mode wherein a total value of every optical confinement coefficients into the every quantum well layers becomes maximum. The lowest ordered mode namely the basic mode is zero-ordered mode. The calculation is made assuming that refractive indexes of air and electrodes are 1 and a refractive index of sapphire substrate is 1.79. Since the n-type AlGaN cladding layer 405 is thick, it does not appear that the light is largely distributed into the cladding layer. Notwithstanding, the aluminum index of the cladding layer 405 is relatively high, for example, 0.15, for which reason a probability of generation of crack in the cladding layer is also high. Namely, the crack is likely to be caused in the cladding layer with high aluminum index.

The first, second and third conventional gallium nitride based semiconductor lasers shown in FIGS. 1, 2 and 3 have the same problems as described above. The aluminum index of the cladding layer is high, for example, in the range of not less than 0.12 to not more than 0.15, for which reason a probability of generation of crack in the cladding layer is also high. Namely, the crack is likely to be caused in the cladding layer with high aluminum index.

The first, second and third conventional gallium nitride based semiconductor lasers shown. in FIGS. 1, 2 and 3 also have an InGaN layer which is provided for prevention of crack in the cladding layer. However, the InGaN layer has a large optical absorption loss. This raises a problem with increase in emission threshold current of the laser.

FIG. 8 is a graph illustrative of optical intensity and refractive index versus a depth from the surface of the semiconductor layer in a gallium nitride based semiconductor laser device of FIG. 5. Individual refractive indexes of every layers in the form of the laser are shown. The optical intensity represents the distribution of light which is calculated in the fourth ordered mode wherein a total value of every optical confinement coefficients into the every quantum well layers becomes maximum. The lowest ordered mode namely the basic mode is zero-ordered mode. The calculation is made assuming that refractive indexes of air and electrodes are 1 and a refractive index of sapphire substrate is 1.79. The aluminum index of the cladding layer is relatively low, for example, in the range of not less 0.05 to not more than 0.07, for which reason a probability of generation of crack in the cladding layer is not so high. Namely, the crack is unlikely to be caused in the cladding layer. Since, however, the aluminum index of the cladding layer is relatively low, the optical confinement is insufficient and the light is largely distributed into the n-type gallium nitride contact layer. This presumption of large distribution of light into the contact layer is somewhat different from the fact because the indium gallium nitride layer provided for the prevention of the crack is capable of absorb the light whereby this absorption of light by the indium gallium nitride layer prevents the light from distribution into the contact layer.

However, the absorption of light by the above indium gallium nitride layer causes a large optical absorption loss thereby raising a problem with the increase in emission threshold current of the laser.

Even if, in order to settle this problem, no InGaN layer is provided, then the light is allowed to be largely distributed into the gallium nitride contact layer. This means that the optical confinement coefficient is low and a high emission threshold current is needed. Further, even if the laser beam is condensed by a lens, a spot size of the condensed laser beam is large.

FIG. 9 is a graph illustrative of optical intensity and refractive index versus a depth from the surface of the semiconductor layer in a gallium nitride based semiconductor laser device of FIG. 6. Individual refractive indexes of every layers in the form of the laser are shown. The optical intensity represents the distribution of light which is calculated in the fourth ordered mode wherein a total value of every optical confinement coefficients into the every quantum well layers becomes maximum. The lowest ordered mode namely the basic mode is zero-ordered mode. The calculation is made assuming that refractive indexes of air and electrodes are 1 and a refractive index of sapphire substrate is 1.79. The aluminum index of the cladding layer is relatively low, for example, in the range of not less 0.05 to not more than 0.07, for which reason a probability of generation of crack in the cladding layer is not so high. Namely, the crack is unlikely to be caused in the cladding layer. Since, however, the aluminum index of the cladding layer is relatively low, the optical confinement is insufficient and the light is largely distributed into the n-type gallium nitride contact layer. This presumption of large distribution of light into the contact layer is somewhat different from the fact because the indium gallium nitride layer provided for the prevention of the crack is capable of absorb the light whereby this absorption of light by the indium gallium nitride layer prevents the light from distribution into the contact layer.

However, the absorption of light by the above indium gallium nitride layer causes a large optical absorption loss thereby raising a problem with the increase in emission threshold current of the laser.

Even if, in order to settle this problem, no InGaN layer is provided, then the light is allowed to be largely distributed into the gallium nitride contact layer. This means that the optical confinement coefficient is low and a high emission threshold current is needed. Further, even if the laser beam is condensed by a lens, a spot size of the condensed laser beam is large.

In the above circumstances, it had been required to develop a novel gallium nitride based semiconductor laser free from the above problems.

SUMMARY OF THE INVENTION

Accordingly, it is an object of the present invention to provide a novel gallium nitride based semiconductor laser free from the above problems.

It is a further object of the present invention to provide a novel gallium nitride based semiconductor laser having a sufficiently high optical confinement coefficient.

It is a still further object of the present invention to provide a novel gallium nitride based semiconductor laser free from a possibility of formation of crack in cladding layer.

It is yet a further object of the present invention to provide a novel gallium nitride based semiconductor laser capable of preventing light from large distribution into n-type gallium nitride contact layer.

It is a further more object of the present invention to provide a novel gallium nitride based semiconductor laser free of unnecessary or additional indium gallium nitride layer capable of absorption of light at high absorption coefficient.

It is still more object of the present invention to provide a novel gallium nitride based semiconductor laser having a low emission threshold current.

It is moreover object of the present invention to provide a novel gallium nitride based semiconductor laser emitting a laser beam which is condensable by a lens to form a beam spot of small size.

It is another object of the present invention to provide a novel gallium nitride based semiconductor laser allowing a high yield of manufacturing the same.

It is still another object of the present invention to provide an improved aluminum gallium nitride cladding layer disposed between a substrate and an active region in a novel gallium nitride based semiconductor laser.

It is yet another object of the present invention to provide an improved aluminum gallium nitride cladding layer disposed between a substrate and an active region in a novel gallium nitride based semiconductor laser free from the above problems.

It is further another object of the present invention to provide an improved aluminum gallium nitride cladding layer disposed between a substrate and an active region in a novel gallium nitride based semiconductor laser having a sufficiently high optical confinement coefficient.

It is an additional object of the present invention to provide an improved aluminum gallium nitride cladding layer disposed between a substrate and an active region in a novel gallium nitride based semiconductor laser free from a possibility of formation of crack in cladding layer.

It is a still additional object of the present invention to provide an improved aluminum gallium nitride cladding layer disposed between a substrate and an active region in a novel gallium nitride based semiconductor laser capable of preventing light from large distribution into n-type gallium nitride contact layer.

It is yet an additional object of the present invention to provide an improved aluminum gallium nitride cladding layer disposed between a substrate and an active region in a novel gallium nitride based semiconductor laser free of unnecessary or additional indium gallium nitride layer capable of absorption of light at high absorption coefficient.

It is a further additional object of the present invention to provide an improved aluminum gallium nitride cladding layer disposed between a substrate and an active region in a novel gallium nitride based semiconductor laser having a low emission threshold current.

It is also additional object of the present invention to provide an improved aluminum gallium nitride cladding layer disposed between a substrate and an active region in a novel gallium nitride based semiconductor laser emitting a laser beam which is condensable by a lens to form a beam spot of small size.

It is also additional object of the present invention to provide an improved aluminum gallium nitride cladding layer disposed between a substrate and an active region in a novel gallium nitride based semiconductor laser allowing a high yield of manufacturing the same.

The above and other objects, features and advantages of the present invention will be apparent from the following descriptions.

In accordance with the first present invention, a cladding layer is provided between a gallium nitride based semiconductor active region and a substrate made of a material having a refraction index which is not lager than a refraction index of gallium nitride. The cladding layer includes at least one $Al_xGa_{1-x}N$ layer. An averaged value of the index "x" of aluminum of the above at least one $Al_xGa_{1-x}N$ layer is in the range of not less than 0.01 to less than 0.05 and a total thickness of the above at least one $Al_xGa_{1-x}N$ layer is not less than 0.7 micrometers as well as the cladding layer has an averaged refractive index which is lower than the refractive index of gallium nitride.

As described above, the averaged value of the index "x" of aluminum of the above at least one $Al_xGa_{1-x}N$ layer is suppressed low values, for example, in the range of not less than 0.01 to less than 0.05, so as to suppress any crack to appear in the cladding layer. It is not necessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above at least one $Al_xGa_{1-x}N$ layer makes the cladding layer decrease in optical confinement into the active region, whilst the increase in total thickness of the above at least one $Al_xGa_{1-x}N$ layer makes the cladding layer increase in optical confinement into the active region. The total thickness of the above at least one $Al_xGa_{1-x}N$ layer is not less than 0.7 micrometers.

The cladding layer may include any other layer than the above $Al_xGa_{1-x}N$ layer with the above low the aluminum index "x", provided that the cladding layer is required to have an averaged refractive index which is lower than the refractive index of gallium nitride for optical confinement into the gallium nitride based active region.

The above improved cladding layer is capable of not only providing a sufficiently large optical confinement into the active region but also avoiding the crack in the cladding layer. Those effects can effectively be exhibited when the substrate is made of a material having a low refractive index which is not larger than a refractive index of gallium nitride. If, contrary to the present invention, the substrate is made of a different material having a high refractive index which is higher than the refractive index of gallium nitride and having a high optical absorption coefficient, then there is no issue to be solved by the present invention.

BRIEF DESCRIPTION OF THE DRAWINGS

Preferred embodiments according to the present invention will be described in detail with reference to the accompanying drawings.

DISCLOSURE OF THE INVENTION

Figure 1:
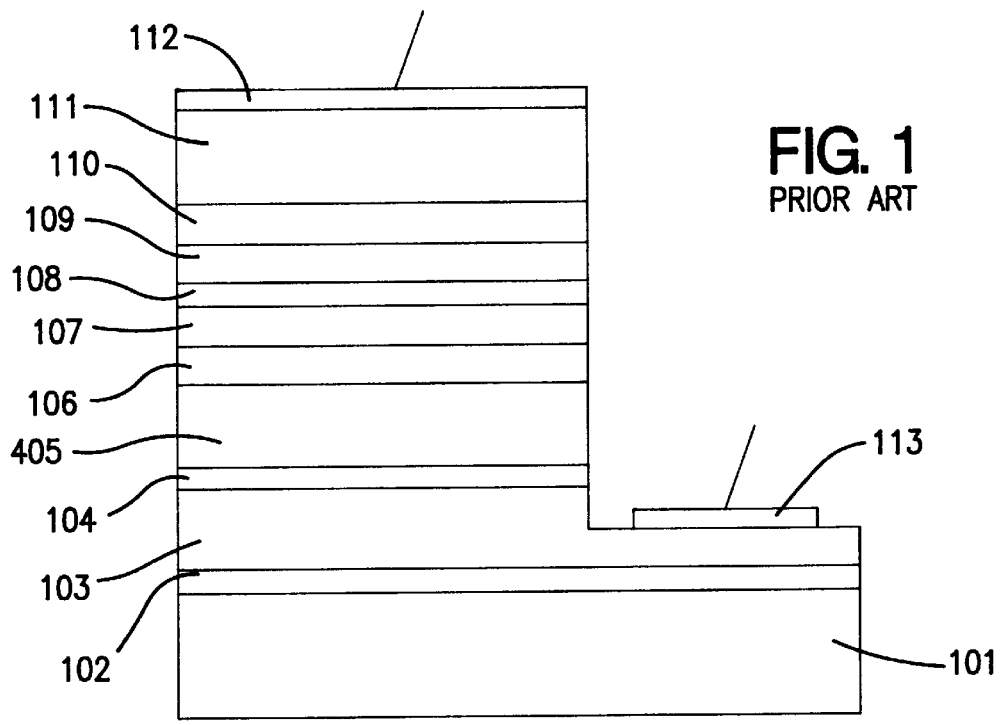
FIG. 1 is a fragmentary cross sectional elevation view illustrative of a gallium nitride based semiconductor laser device in a first prior art.
Figure 2:
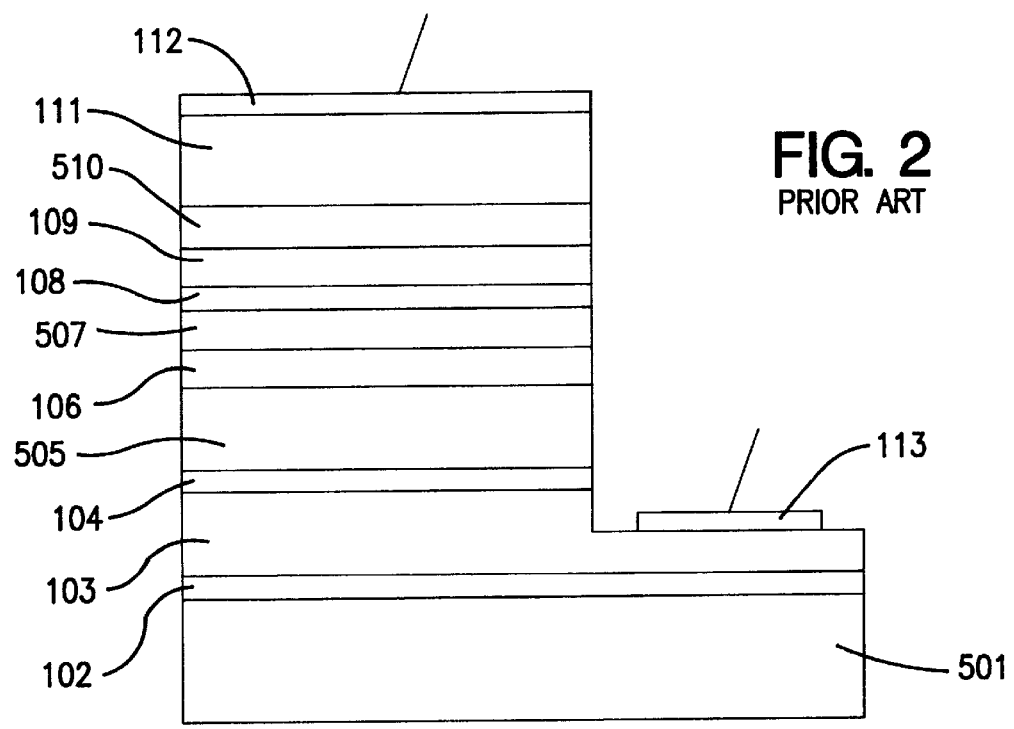
FIG. 2 is a fragmentary cross sectional elevation view illustrative of a gallium nitride based semiconductor laser device in a second prior art.
Figure 3:
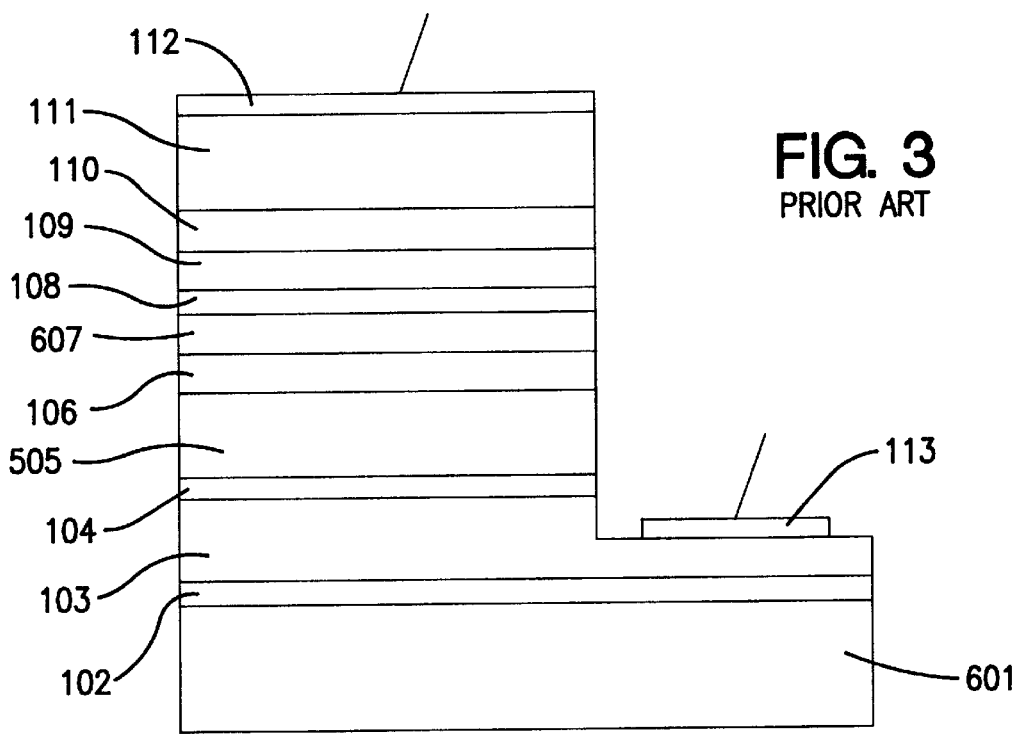
FIG. 3 is a fragmentary cross sectional elevation view illustrative of a gallium nitride based semiconductor laser device in a third prior art.
Figure 4:
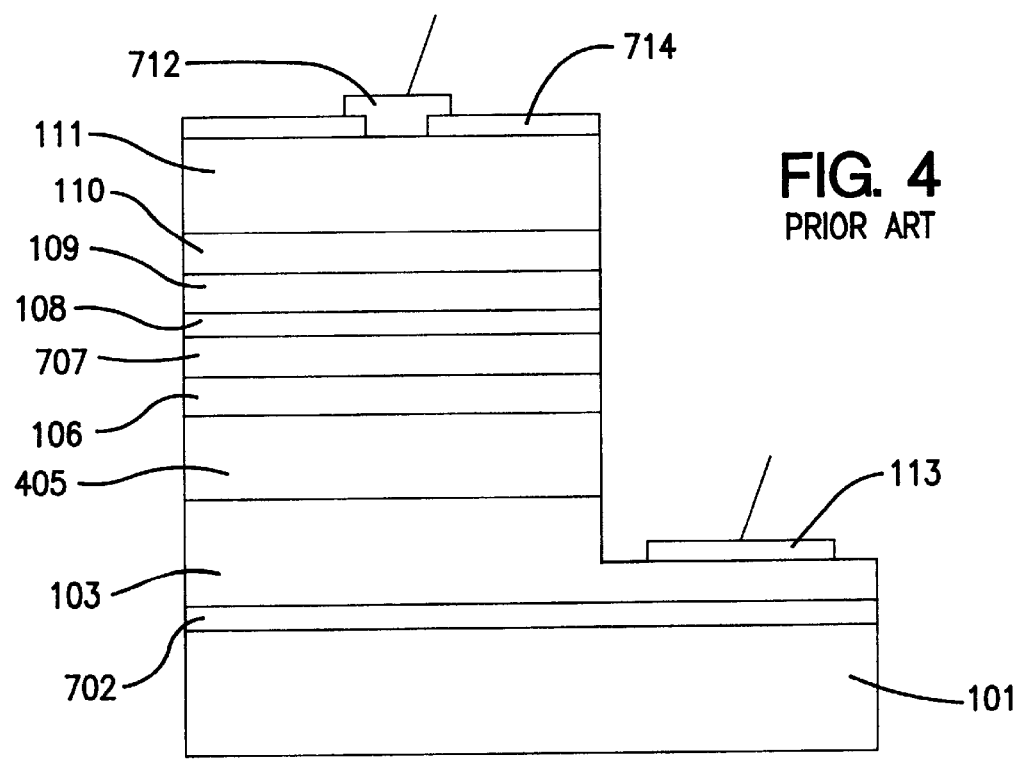
FIG. 4 is a fragmentary cross sectional elevation view illustrative of a gallium nitride based semiconductor laser device in a fourth prior art.
Figure 5:
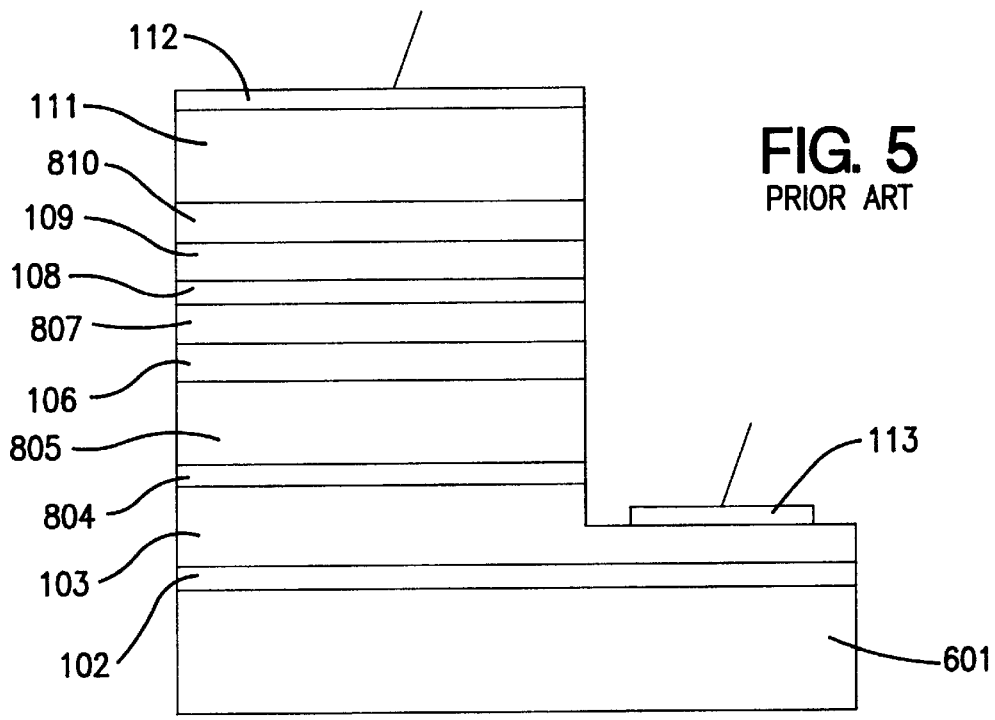
FIG. 5 is a fragmentary cross sectional elevation view illustrative of a gallium nitride based semiconductor laser device in a fifth prior art.
Figure 6:
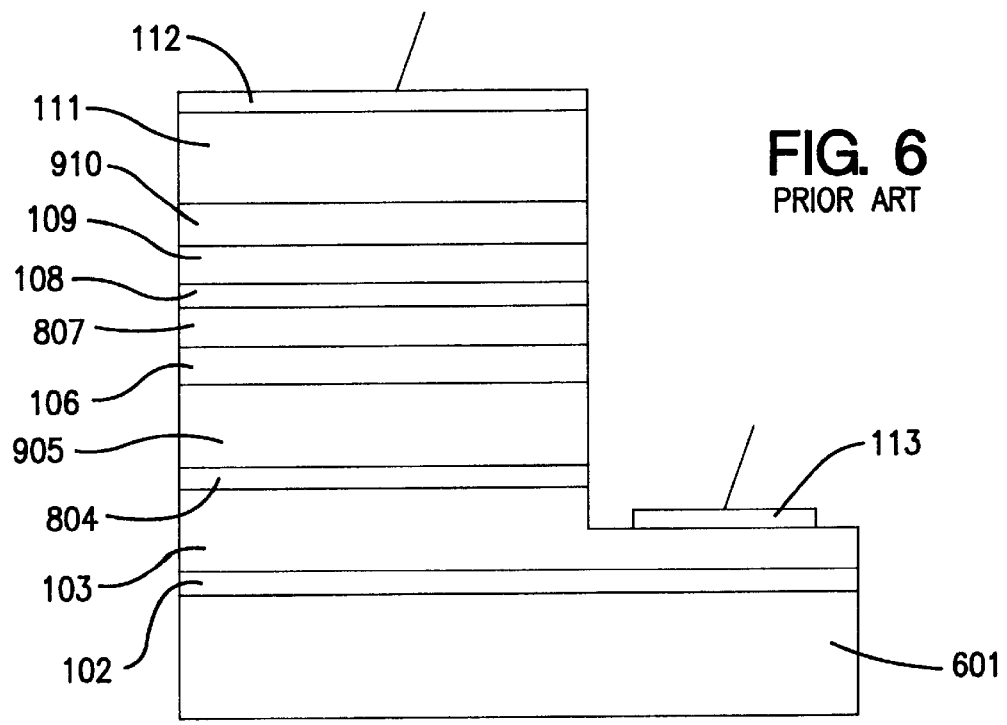
FIG. 6 is a fragmentary cross sectional elevation view illustrative of a gallium nitride based semiconductor laser device in a sixth prior art.
Figure 7:
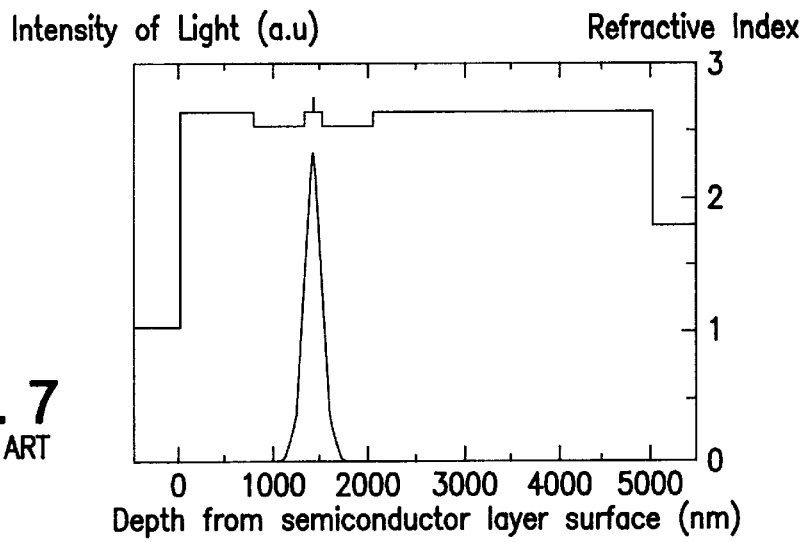
FIG. 7 is a graph illustrative of optical intensity and refractive index versus a depth from the surface of the semiconductor layer in a gallium nitride based semiconductor laser device of FIG. 4.
Figure 8:
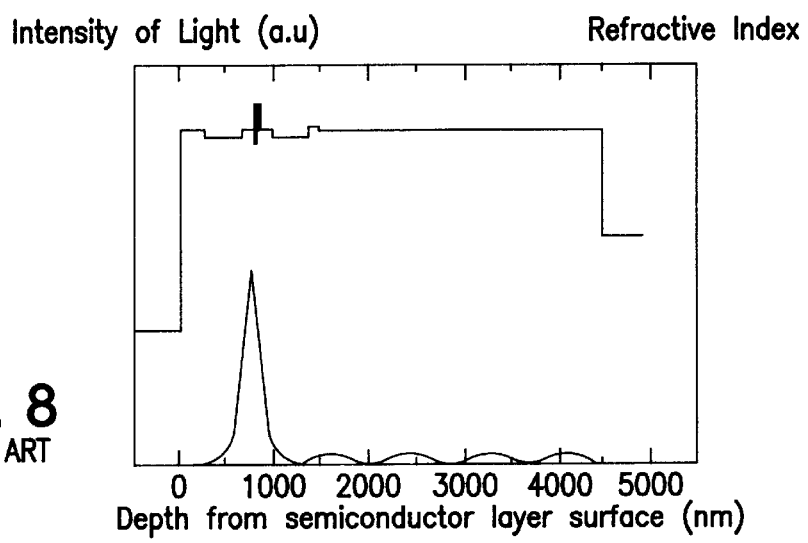
FIG. 8 is a graph illustrative of optical intensity and refractive index versus a depth from the surface of the semiconductor layer in a gallium nitride based semiconductor laser device of FIG. 5.
Figure 9:
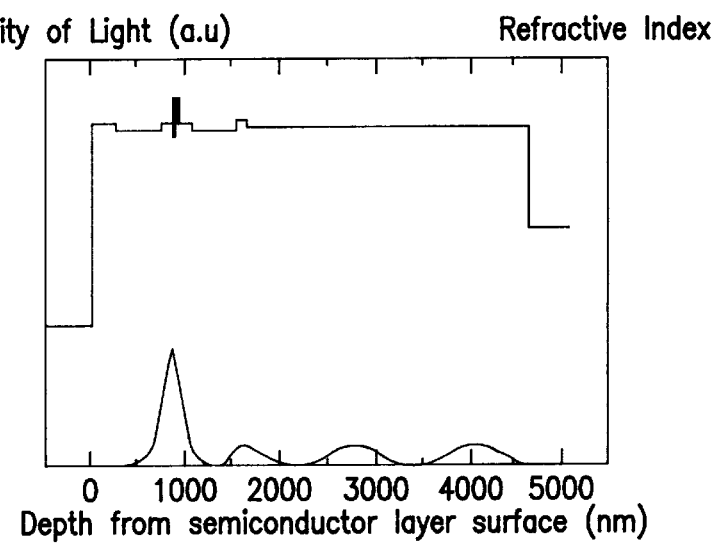
FIG. 9 is a graph illustrative of optical intensity and refractive index versus a depth from the surface of the semiconductor layer in a gallium nitride based semiconductor laser device of FIG. 6.

In accordance with the first present invention, a cladding layer is provided between a gallium nitride based semiconductor active region and a substrate made of a material having a refraction index which is not lager than a refraction index of gallium nitride. The cladding layer includes at least one $Al_xGa_{1-x}N$ layer. An averaged value of the index "x" of aluminum of the above at least one $Al_xGa_{1-x}N$ layer is in the range of not less than 0.01 to less than 0.05 and a total thickness of the above at least one $Al_xGa_{1-x}N$ layer is not less than 0.7 micrometers as well as the cladding layer has an averaged refractive index which is lower than the refractive index of gallium nitride.

As described above, the averaged value of the index "x" of aluminum of the above at least one $Al_xGa_{1-x}N$ layer is suppressed low values, for example, in the range of not less than 0.01 to less than 0.05, so as to suppress any crack to appear in the cladding layer. It is not necessary to provide all InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above at least one $Al_xGa_{1-x}N$ layer makes the cladding layer decrease in optical confinement into the active region, whilst the increase in total thickness of the above at least one $Al_xGa_{1-x}N$ layer makes the cladding layer increase in optical confinement into the active region. The total thickness of the above at least one $Al_xGa_{1-x}N$ layer is not less than 0.7 micrometers.

The cladding layer may include any other layer than the above $Al_xGa_{1-x}N$ layer with the above low the aluminum index "x", provided that the cladding layer is required to have an averaged refractive index which is lower than the refractive index of gallium nitride for optical confinement into the gallium nitride based active region.

The above improved cladding layer is capable of not only providing a sufficiently large optical confinement into the active region but also avoiding the crack in the cladding layer. Those effects can effectively be exhibited when the substrate is made of a material having a low refractive index which is not larger than a refractive index of gallium nitride. If, contrary to the present invention, the substrate is made of a different material having a high refractive index which is higher than the refractive index of gallium nitride and having a high optical absorption coefficient, then there is no issue to be solved by the present invention.

The cladding layer may comprise a single $Al_xGa_{1-x}N$ layer and the index "x" of aluminum of the single $Al_xGa_{1-x}N$ layer is constant at a value in the range of not less than 0.01 to less than 0.05. In this case, more preferably, the index "x" of aluminum of the single $Al_xGa_{1-x}N$ layer is constant at a value in the range of not less than 0.01 to less than 0.03 and a thickness of the single $Al_xGa_{1-x}N$ layer is not less than 0.1 micrometer.

Alternatively, the cladding layer may comprise a single $Al_xGa_{1-x}N$ layer and the index "x" of aluminum of the single $Al_xGa_{1-x}N$ layer is continuously varied so that the averaged value of the index "x" is in the range of not less than 0.01 to less than 0.05. For example, the index "x" of aluminum of the single $Al_xGa_{1-x}N$ layer may linearly be varied so that the averaged value of the index "x" is in the range of not less than 0.01 to less than 0.05. Preferably, the index "x" of aluminum of the single $Al_xGa_{1-x}N$ layer is varied to proportionally decrease in a thickness direction from the substrate to the active region in the light of obtaining an increased efficiency of the optical confinement without unnecessary increase in the aluminum index "x". Alternatively, the index "x" of aluminum of the single $Al_xGa_{1-x}N$ layer may be non-linearly varied so that the averaged value of the index "x" is in the range of not less than 0.01 to less than 0.05. For example, the aluminum index profile may have a non-linear curve in the thickness direction of the cladding layer.

Alternatively, the cladding layer may comprise a single $Al_xGa_{1-x}N$ layer and the index "x" of aluminum of the single $Al_xGa_{1-x}N$ layer is discontinuously varied so that the averaged value of the index "x" is in the range of not less than 0.01 to less than 0.05. In this case, for example, the index "x" of aluminum of the single $Al_xGa_{1-x}N$ layer may be varied step-like so that the averaged value of the index "x" is in the range of not less than 0.01 to less than 0.05. Preferably, the index "x" of aluminum of the single $Al_xGa_{1-x}N$ layer may be varied step-like to discontinuously increase in a thickness direction from the substrate to the active region in the light of obtaining an increased efficiency of the optical confinement without unnecessary increase in the aluminum index "x".

Further alternatively, the cladding layer may comprise laminations of a plurality of $Al_xGa_{1-x}N$ layers, provided that an averaged value of the index "x" of aluminum of the plurality of $Al_xGa_{1-x}N$ layers is in the range of not less than 0.01 to less than 0.05 and a total thickness of the plurality of $Al_xGa_{1-x}N$ layers is not less than 0.7 micrometers. In this case, the plurality of $Al_xGa_{1-x}N$ layers may differ in the index "x" from each other. For example, each of the plurality of $Al_xGa_{1-x}N$ layers may have a thickness less than 7 micrometers, provided that a total thickness of the plurality of $Al_xGa_{1-x}N$ layers is not less than 7 micrometers.

Further, adjacent two of the above plural $Al_xGa_{1-x}N$ layers may be separated by an InGaN layer having a thickness of not larger than 300 nanometers so that an averaged value of the index "x" of aluminum of the cladding layer is in the range of not less than 0.01 to less than 0.05. If the thickness of the InGaN layer exceeds 300 nanometers, then a probability of generation of the crystal defect or crystal dislocation in the growth of the cladding layer is high. In the light of the growth of the cladding layer, a possible thin InGaN layer is preferable.

Furthermore, the cladding layer may comprise laminations of alternating $Al_xGa_{1-x}N$ layers and GaN layers so that a total thickness of the cladding layer is not less than 7 micrometers and the averaged value of the index "x" of aluminum in the cladding layer is in the range of not less than 0.01 to less than 0.05. In this case, the thicknesses of the alternating $Al_xGa_{1-x}N$ layers and GaN layers are in the order of ten nanometers. For this reason, the period of alternating $Al_xGa_{1-x}N$ layers and GaN layers is large, for example, at least several tens.

As described above, the substrate is made of the material having a low refractive index which is not larger than a refractive index of gallium nitride. The may comprise for example, a sapphire substrate, a spinel ($MgAl_2O_3$) substrate and a gallium nitride substrate.

The gallium nitride based semiconductor active region may comprise an indium gallium nitride active layer and an indium gallium nitride optical guide layer in contact with the indium gallium nitride active layer.

A gallium nitride layer is further disposed between the substrate and the cladding layer, wherein a thickness of the gallium nitride layer is not larger than 1.0 micrometer. Since, however, the aluminum gallium nitride cladding layer may also play the same roll as the contact layer, it is possible to reduce the thickness of the gallium nitride contact layer. This results in reduction in a total thickness of the semiconductor layers. This further reduces a probability of generation of crack in those semiconductor layers. An electrode may be provided in contact with either a part of the gallium nitride contact layer disposed between the aluminum gallium nitride cladding layer and the substrate or a part of the aluminum gallium nitride cladding layer directly.

The second present invention provides a gallium nitride based semiconductor multi-layer structure in a semiconductor laser device. The gallium nitride based semiconductor multi-layer structure comprises a substrate made of a material having a refraction index which is not lager than a refraction index of gallium nitride, a gallium nitride based semiconductor active region, and a cladding layer provided between the substrate and the active region. The cladding layer includes at least one $Al_xGa_{1-x}N$ layer. An averaged value of the index "x" of aluminum of the above at least one $Al_xGa_{1-x}N$ layer is in the range of not less than 0.01 to less than 0.05 and a total thickness of the above at least one $Al_xGa_{1-x}N$ layer is not less than 0.7 micrometers as well as the cladding layer has an averaged refractive index which is lower than the refractive index of gallium nitride.

As described above, the averaged value of the index "x" of aluminum of the above at least one $Al_xGa_{1-x}N$ layer is suppressed low values, for example, in the range of not less than 0.01 to less than 0.05, so as to suppress any crack to appear in the cladding layer. It is not necessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above at least one $Al_xGa_{1-x}N$ layer makes the cladding layer decrease in optical confinement into the active region, whilst the increase in total thickness of the above at least one $Al_xGa_{1-x}N$ layer makes the cladding layer increase in optical confinement into the active region. The total thickness of the above at least one $Al_xGa_{1-x}N$ layer is not less than 0.7 micrometers.

The cladding layer may include any other layer than the above $Al_xGa_{1-x}N$ layer with the above low the aluminum index "x", provided that the cladding layer is required to have an averaged refractive index which is lower than the refractive index of gallium nitride for optical confinement into the gallium nitride based active region.

The above improved cladding layer is capable of not only providing a sufficiently large optical confinement into the active region but also avoiding the crack in the cladding layer. Those effects can effectively be exhibited when the substrate is made of a material having a low refractive index which is not larger than a refractive index of gallium nitride. If, contrary to the present invention, the substrate is made of a different material having a high refractive index which is higher than the refractive index of gallium nitride and having a high optical absorption coefficient, then there is no issue to be solved by the present invention.

The cladding layer may comprise a single $Al_xGa_{1-x}N$ layer and the index "x" of aluminum of the single $Al_xGa_{1-x}N$ layer is constant at a value in the range of not less than 0.01 to less than 0.05. In this case, more preferably, the index "x" of aluminum of the single $Al_xGa_{1-x}N$ layer is constant at a value in the range of not less than 0.01 to less than 0.03 and a thickness of the single $Al_xGa_{1-x}N$ layer is not less than 0.1 micrometer.

Alternatively, the cladding layer may comprise a single $Al_xGa_{1-x}N$ layer and the index "x" of aluminum of the single $Al_xGa_{1-x}N$ layer is continuously varied so that the averaged value of the index "x" is in the range of not less than 0.01 to less than 0.05. For example, the index "x" of aluminum of the single $Al_xGa_{1-x}N$ layer may linearly be varied so that the averaged value of the index "x" is in the range of not less than 0.01 to less than 0.05. Preferably, the index "x" of aluminum of the single $Al_xGa_{1-x}N$ layer is varied to proportionally decrease in a thickness direction from the substrate to the active region in the light of obtaining an increased efficiency of the optical confinement without unnecessary increase in the aluminum index "x".

Alternatively, the index "x" of aluminum of the single $Al_xGa_{1-x}N$ layer may be non-linearly varied so that the averaged value of the index "x" is in the range of not less than 0.01 to less than 0.05. For example, the aluminum index profile may have a non-linear curve in the thickness direction of the cladding layer.

Alternatively, the cladding layer may comprise a single $Al_xGa_{1-x}N$ layer and the index "x" of aluminum of the single $Al_xGa_{1-x}N$ layer is discontinuously varied so that the averaged value of the index "x" is in the range of not less than 0.01 to less than 0.05. In this cases for example, the index "x" of aluminum of the single $Al_xGa_{1-x}N$ layer may be varied step-like so that the averaged value of the index "x" is in the range of not less than 0.01 to less than 0.05. Preferably, the index "x" of aluminum of the single $Al_xGa_{1-x}N$ layer may be varied step-like to discontinuously increase in a thickness direction from the substrate to the active region in the light of obtaining an increased efficiency of the optical confinement without unnecessary increase in the aluminum index "x".

Further alternatively, the cladding layer may comprise laminations of a plurality of $Al_xGa_{1-x}N$ layers, provided that an averaged value of the index "x" of aluminum of the plurality of $Al_xGa_{1-x}N$ layers is in the range of not less than 0.01 to less than 0.05 and a total thickness of the plurality of $Al_xGa_{1-x}N$ layers is not less than 0.7 micrometers. In this case, the plurality of $Al_xGa_{1-x}N$ layers may differ in the index "x" from each other. For example, each of the plurality of $Al_xGa_{1-x}N$ layers may have a thickness less than 7 micrometers, provided that a total thickness of the plurality of $Al_xGa_{1-x}N$ layers is not less than 7 micrometers.

Further, adjacent two of the above plural $Al_xGa_{1-x}N$ layers may be separated by an InGaN layer having a thickness of not larger than 300 nanometers so that an averaged value of the index "x" of aluminum of the cladding layer is in the range of not less than 0.01 to less than 0.05. If the thickness of the InGaN layer exceeds 300 nanometers, then a probability of generation of the crystal defect or crystal dislocation in the growth of the cladding layer is high. In the light of the growth of the cladding layer, a possible thin InGaN layer is preferable.

Furthermore, the cladding layer may comprise laminations of alternating $Al_xGa_{1-x}N$ layers and GaN layers so that a total thickness of the cladding layer is not less than 7 micrometers and the averaged value of the index "x" of aluminum in the cladding layer is in the range of not less than 0.01 to less than 0.05. In this case, the thicknesses of the alternating $Al_xGa_{1-x}N$ layers and GaN layers are in the order of ten nanometers. For this reason, the period of alternating $Al_xGa_{1-x}N$ layers and GaN layers is large, for example, at least several tens.

As described above, the substrate is made of the material having a low refractive index which is not larger than a refractive index of gallium nitride. The may comprise for example, a sapphire substrate, a spinel ($MgAl_2O_3$) substrate and a gallium nitride substrate.

The gallium nitride based semiconductor active region may comprise an indium gallium nitride active layer and an indium gallium nitride optical guide layer in contact with the indium gallium nitride active layer.

A gallium nitride layer is further disposed between the substrate and the cladding layer, wherein a thickness of the gallium nitride layer is not larger than 1.0 micrometer. Since, however, the aluminum gallium nitride cladding layer may also play the same roll as the contact layer, it is possible to reduce the thickness of the gallium nitride contact layer. This results in reduction in a total thickness of the semiconductor layers. This further reduces a probability of generation of crack in those semiconductor layers. An electrode may be provided in contact with either a part of the gallium nitride contact layer disposed between the aluminum gallium nitride cladding layer and the substrate or a part of the aluminum gallium nitride cladding layer directly.

The third present invention provides a gallium nitride based semiconductor laser device which comprises the following elements. A substrate is made of a material having a refraction index which is not lager than a refraction index of gallium nitride. A first contact layer is made of gallium nitride and the first contact layer is provided over the substrate. A first cladding layer is provided over the first contact layer. The cladding layer includes at least one $Al_xGa_{1-x}N$ layer. A gallium nitride based semiconductor active region is provided over the cladding layer. A second cladding layer is provided over the gallium nitride based semiconductor active region. A second contact layer is provided over the second cladding layer. A first electrode is provided in contact with either the first contact layer or the first cladding layer. A second electrode is provided in contact with the second contact layer. An averaged value of the index "x" of aluminum of the above at least one $Al_xGa_{1-x}N$ layer is in the range of not less than 0.01 to less than 0.05 and a total thickness of the above at least one $Al_xGa_{1-x}N$ layer is not less than 0.7 micrometers as well as the cladding layer has an averaged refractive index which is lower than the refractive index of gallium nitride.

As described above, the averaged value of the index "x" of aluminum of the above at least one $Al_xGa_{1-x}N$ layer is suppressed low values, for example, in the range of not less than 0.01 to less than 0.05, so as to suppress any crack to appear in the first cladding layer. It is not necessary to provide an InGaN layer having a large optical absorption loss for the propose of prevention of the crack in the first cladding layer. No provision of such layer having the large optical absorption loss allows a substantial reduction in a threshold current for laser emission.

The drop of the averaged value of the index "x" of aluminum of the above at least one $Al_xGa_{1-x}N$ layer makes the first cladding layer decrease in optical confinement into the active region, whilst the increase in total thickness of the above at least one $Al_xGa_{1-x}N$ layer makes the first cladding layer increase in optical confinement into the active region. The total thickness of the above at least one $Al_xGa_{1-x}N$ layer is not less than 0.7 micrometers.

The first cladding layer may include any other layer than the above $Al_xGa_{1-x}N$ layer with the above low the aluminum index "x", provided that the first cladding layer is required to have an averaged refractive index which is lower than the refractive index of gallium nitride for optical confinement into the gallium nitride based active region.

The above improved first cladding layer is capable of not only providing a sufficiently large optical confinement into the active region but also avoiding the crack in the first cladding layer. Those effects of the present invention can effectively be exhibited when the substrate is made of a material having a low refractive index which is not larger than a refractive index of gallium nitride. If, contrary to the present invention, the substrate is made of a different material having a high refractive index which is higher than the refractive index of gallium nitride and having a high optical absorption coefficient, then there is no issue to be solved by the present invention.

The drop of the averaged value of the index "x" of aluminum of the above at least one $Al_xGa_{1-x}N$ layer makes the first cladding layer decrease in optical confinement into the active region, whilst the increase in total thickness of the above at least one $Al_xGa_{1-x}N$ layer makes the first cladding layer increase in optical confinement into the active region. The total thickness of the above at least one $Al_xGa_{1-x}N$ layer is not less than 0.7 micrometers.

The first cladding layer may include any other layer than the above $Al_xGa_{1-x}N$ layer with the above low the aluminum index "x", provided that the first cladding layer is required to have an averaged refractive index which is lower than the refractive index of gallium nitride for optical confinement into the gallium nitride based active region.

The above improved first cladding layer is capable of not only providing a sufficiently large optical confinement into the active region but also avoiding the crack in the first cladding layer. Those effects can effectively be exhibited when the substrate is made of a material having a low refractive index which is not larger than a refractive index of gallium nitride. If, contrary to the present invention, the substrate is made of a different material having a high refractive index which is higher than the refractive index of gallium nitride and having a high optical absorption coefficient, then there is no issue to be solved by the present invention.

The first cladding layer may comprise a single $Al_xGa_{1-x}N$ layer and the index "x" of aluminum of the single $Al_xGa_{1-x}N$ layer is constant at a value in the range of not less than 0.01 to less than 0.05. In this case, more preferably, the index "x" of aluminum of the single $Al_xGa_{1-x}N$ layer is constant at a value in the range of not less than 0.01 to less than 0.03 and a thickness of the single $Al_xGa_{1-x}N$ layer is not less than 0.1 micrometer.

Alternatively, the first cladding layer may comprise a single $Al_xGa_{1-x}N$ layer and the index "x" of aluminum of the single $Al_xGa_{1-x}N$ layer is continuously varied so that the averaged value of the index "x" is in the range of not less than 0.01 to less than 0.05. For example, the index "x" of aluminum of the single $Al_xGa_{1-x}N$ layer may linearly be varied so that the averaged value of the index "x" is in the range of not less than 0.01 to less than 0.05. Preferably, the index "x" of aluminum of the single $Al_xGa_{1-x}N$ layer is varied to proportionally decrease in a thickness direction from the substrate to the active region in the light of obtaining an increased efficiency of the optical confinement without unnecessary increase in the aluminum index "x". Alternatively, the index "x" of aluminum of the single $Al_xGa_{1-x}N$ layer may be non-linearly varied so that the averaged value of the index "x" is in the range of not less than 0.01 to less than 0.05. For example, the aluminum index profile may have a non-linear curve in the thickness direction of the first cladding layer.

Alternatively, the first cladding layer may comprise a single $Al_xGa_{1-x}N$ layer and the index "x" of aluminum of the single $Al_xGa_{1-x}N$ layer is discontinuously varied so that the averaged value of the index "x" is in the range of not less than 0.01 to less than 0.05. In this case, for example, the index "x" of aluminum of the single $Al_xGa_{1-x}N$ layer may be varied step-like so that the averaged value of the index "x" is in the range of not less than 0.01 to less than 0.05. Preferably, the index "x" of aluminum of the single $Al_xGa_{1-x}N$ layer may be varied step-like to discontinuously increase in a thickness direction from the substrate to the active region in the light of obtaining an increased efficiency of the optical confinement without unnecessary increase in the aluminum index "x".

Further alternatively, the first cladding layer may comprise laminations of a plurality of $Al_xGa_{1-x}N$ layers, provided that an averaged value of the index "x" of aluminum of the plurality of $Al_xGa_{1-x}N$ layers is in the range of not less than 0.01 to less than 0.05 and a total thickness of the plurality of $Al_xGa_{1-x}N$ layers is not less than 0.7 micrometers. In this case, the plurality of $Al_xGa_{1-x}N$ layers may differ in the index "x" from each other. For example, each of the plurality of $Al_xGa_{1-x}N$ layers may have a thickness less than 7 micrometers, provided that a total thickness of the plurality of $Al_xGa_{1-x}N$ layers is not less than 7 micrometers.

Further, adjacent two of the above plural $Al_xGa_{1-x}N$ layers may be separated by an InGaN layer having a thickness of not larger than 300 nanometers so that an averaged value of the index "x" of aluminum of the first cladding layer is in the range of not less than 0.01 to less than 0.05. If the thickness of the InGaN layer exceeds 300 nanometers, then a probability of generation of the crystal defect or crystal dislocation in the growth of the first cladding layer is high. In the light of the growth of the first cladding layer, a possible thin InGaN layer is preferable.

Furthermore, the first cladding layer may comprise laminations of alternating $Al_xGa_{1-x}N$ layers and GaN layers so that a total thickness of the first cladding layer is not less than 7 micrometers and the averaged value of the index "x" of aluminum in the first cladding layer is in the range of not less than 0.01 to less than 0.05. In this case, the thicknesses of the alternating AlxGa1-xN layers and GaN layers are in the order of ten nanometers. For this reason, the period of alternating AlxGa1-xN layers and GaN layers is large, for example, at least several tens.

As described above, the substrate is made of the material having a low refractive index which is not larger than a refractive index of gallium nitride. The may comprise for example, a sapphire substrate, a spinel ($MgAl_2O_3$) substrate and a gallium nitride substrate.

The gallium nitride based semiconductor active region may comprise an indium gallium nitride active layer and an indium gallium nitride optical guide layer in contact with the indium gallium nitride active layer.

A gallium nitride layer is further disposed between the substrate and the first cladding layer, wherein a thickness of the gallium nitride layer is not larger than 1.0 micrometer. Since, however, the aluminum gallium nitride first cladding layer may also play the same roll as the contact layer, it is possible to reduce the thickness of the gallium nitride contact layer. This results in reduction in a total thickness of the semiconductor layers. This further reduces a probability of generation of crack in those semiconductor layers. An electrode may be provided in contact with either a part of the gallium nitride contact layer disposed between the aluminum gallium nitride first cladding layer and the substrate or a part of the aluminum gallium nitride first cladding layer directly.

In accordance with the foregoing present inventions, concretely, the cladding layer disposed between the substrate and the active region may comprise an $Al_{0.04}Ga_{0.96}N$ layer having a thickness of 1.0 micrometer and the gallium nitride contact layer between the cladding layer and the substrate has a thickness of 1.5 micrometers and is in contact with the electrode for not only providing a sufficiently large optical confinement into the active region but also avoiding the crack in the cladding layer.

Alternatively, the cladding layer disposed between the substrate and the active region may comprise an $Al_{0.02}Ga_{0.98}N$ layer having a thickness of 1.5 micrometer and the gallium nitride contact layer between the cladding layer and the substrate has a thickness of 1.5 micrometers and is in contact with the electrode for not only providing a sufficiently large optical confinement into the active region but also avoiding the crack in the cladding layer.

Further, alternatively, the cladding layer disposed between the substrate and the active region may comprise an $Al_{0.02}Ga_{0.98}N$ layer having a thickness of 1.5 micrometer and is in contact with the electrode for not only providing a sufficiently large optical confinement into the active region but also avoiding the crack in the cladding layer. There is raised no substantive problem with the increase in contact resistance of the electrode because $Al_{0.02}Ga_{0.98}N$ has almost no difference in energy band gap from gallium nitride. The gallium nitride contact layer between the cladding layer and the substrate has a thickness of 0.5 micrometers. Since the aluminum gallium nitride first cladding layer may also play the same roll as the contact layer, it is possible to reduce the thickness of the gallium nitride contact layer. This results in reduction in a total thickness of the semiconductor layers. This further reduces a probability of generation of crack in those semiconductor layers.

Further, alternatively, the cladding layer disposed between the substrate and the active region may comprise laminations of an $Al_{0.02}Ga_{0.98}N$ layer having a thickness of 1.5 micrometer and is in contact with the electrode and an $Al_{0.07}Ga_{0.93}N$ layer having a thickness of 0.4 micrometer for not only providing a sufficiently large optical confinement into the active region but also avoiding the crack in the cladding layer. The $Al_{0.07}Ga_{0.93}N$ layer is in contact with the active region whilst the $Al_{0.02}Ga_{0.98}N$ layer is positioned closer to the substrate. There is raised no substantive problem with the increase in contact resistance of the electrode because $Al_{0.02}Ga_{0.98}N$ has almost no difference in energy band gap from gallium nitride. The gallium nitride contact layer between the cladding layer and the substrate has a thickness of 0.5 micrometers. Since the aluminum gallium nitride first cladding layer may also play the same roll as the contact layer, it is possible to reduce the thickness of the gallium nitride contact layer. This results in reduction in a total thickness of the semiconductor layers. This further reduces a probability of generation of crack in those semiconductor layers.

PREFERRED EMBODIMENTS

FIRST EMBODIMENT

A first embodiment according to the present invention will be described in detail with reference to FIG. 10 which is a fragmentary cross sectional elevation view illustrative of a gallium nitride based semiconductor laser device. The gallium nitride based semiconductor laser device is formed on a (11-20)-face of a sapphire substrate 501. An undoped GaN buffer layer 102 is provided on the (11-20)face of the sapphire substrate 501. The undoped GaN buffer layer 102 has a thickness of 500 Å. An n-type GaN contact layer 103 is provided on the undoped GaN buffer layer 102. The n-type GaN contact layer 103 is doped with Si. The n-type GaN contact layer 103 has a thickness of 1.5 $\mu$m. An n-type $Al_{0.04}Ga_{0.96}N$ cladding layer 105 is provided on the n-type GaN contact layer 103. The n-type $Al_{0.04}Ga_{0.96}N$ cladding layer 105 is doped with Si. The n-type $Al_{0.04}Ga_{0.96}N$ cladding layer 105 has a thickness of 1 $\mu$m. An n-type GaN optical guide layer 106 is provided on the n-type $Al_{0.04}Ga_{0.96}N$ cladding layer 105. The n-type GaN optical guide layer 106 is doped with Si. The n-type GaN optical guide layer 106 has a thickness of 0.1 $\mu$m. A multiple quantum well active layer 807 is provided on the n-type GaN optical guide layer 106. The multiple quantum well active layer 807 comprises 7 periods of alternating laminations of undoped $In_{0.2}Ga_{0.8}N$ quantum well layers having a thickness of 25 Å and undoped $In_{0.05}Ga_{0.95}N$ barrier layers having a thickness of 50 Å. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppression of dissociation and evaporation of indium from the undoped $In_{0.2}Ga_{0.8}N$ quantum well layers or the undoped $In_{0.05}Ga_{0.95}N$ barrier layers. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 $\mu$m. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $Al_{0.07}Ga_{0.93}N$ cladding layer 810 has a thickness of 0.4 $\mu$m. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 $\mu$m. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises laminations of a titanium layer and an aluminum layer.

Figures 10, 11:
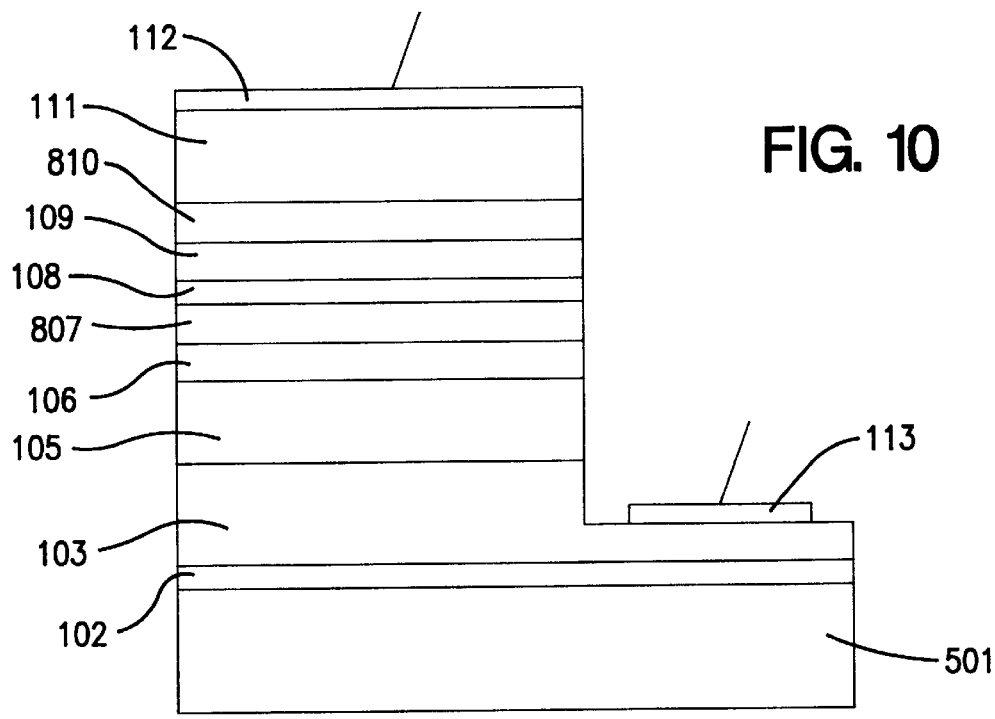
FIG. 10 is a fragmentary cross sectional elevation view illustrative of a gallium nitride based semiconductor laser device in a first embodiment according to the present invention.
FIG. 11 is a diagram illustrative of a profile of an aluminum index "x" of the n-type $Al_{0.04}Ga_{0.96}N$ cladding layer 105 having a thickness of 1 μm in a first embodiment according to the present invention.

FIG. 11 is a diagram illustrative of a profile of an aluminum index "x" of the n-type $Al_{0.04}Ga_{0.96}N$ cladding layer 105 having a thickness of 1 $\mu$m. As shown in FIG. 11, the aluminum index "x" of the n-type $Al_{0.04}Ga_{0.96}N$ cladding layer 105 is kept contact at 0.04. Namely, the averaged value of the index "x" of aluminum of the above $Al_{0.04}Ga_{0.96}N$ layer is suppressed low values, for example, in the range of not less than 0.01 to less than 0.05, so as to suppress any crack to appear in the cladding layer. It is therefore unnecessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above $Al_{0.04}Ga_{0.96}N$ cladding layer makes the cladding layer decrease in optical confinement into the active region, whilst the increase in total thickness of the above $Al_{0.04}Ga_{0.96}N$ layer makes the cladding layer increase in optical confinement into the active region. The total thickness of the above $Al_{0.04}Ga_{0.96}N$ layer is 1 micrometer which is larger than 0.7 micrometers.

Figure 12:
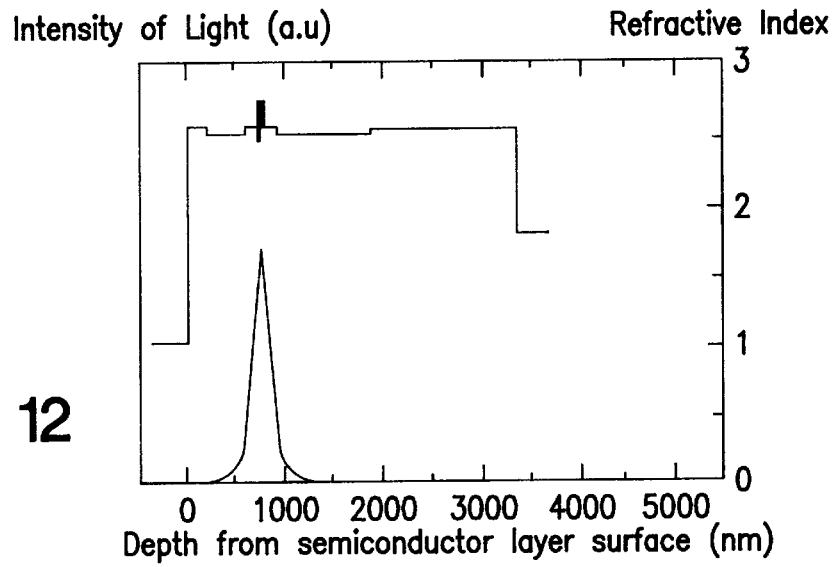
FIG. 12 is a graph illustrative of optical intensity and refractive index versus a depth from the surface of the semiconductor layer in a first embodiment according to the present invention.

FIG. 12 is a graph illustrative of optical intensity and refractive index versus a depth from the surface of the semiconductor layer. The optical intensity is obtained by such a calculation of an optical distribution in the first order mode that a total value of confinement coefficients into individual quantum well layers in transverse electric mode (TE-mode) becomes maximum. The above improved cladding layer 105 provides a sufficiently large optical confinement into the active region including the active layer 807 and the optical guide layer 106 without optical dispersion into the cladding layer 105 and the GaN contact layer 103.

Accordingly, the above improved cladding layer 105 is capable of not only providing a sufficiently large optical confinement into the active region but also avoiding the crack in the cladding layer 105.

SECOND EMBODIMENT

Figure 13:
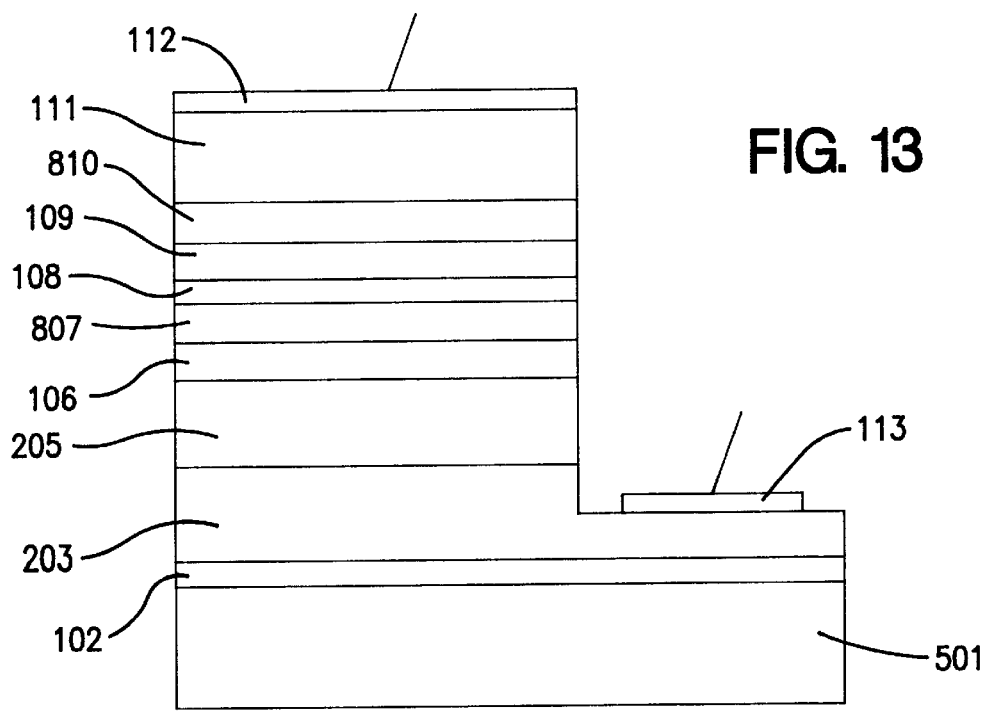
FIG. 13 is a fragmentary cross sectional elevation view illustrative of a gallium nitride based semiconductor laser device in a second embodiment according to the present invention.

A second embodiment according to the present invention will be described in detail with reference to FIG. 13 which is a fragmentary cross sectional elevation view illustrative of a gallium nitride based semiconductor laser device. The gallium nitride based semiconductor laser device is formed on a (11-20)-face of a sapphire substrate 501. An undoped GaN buffer layer 102 is provided on the (11-20)-face of the sapphire substrate 501. The undoped GaN buffer layer 102 has a thickness of 500 Å. An n-type GaN contact layer 103 is provided on the undoped GaN buffer layer 102. The n-type GaN contact layer 103 is doped with Si. The n-type GaN contact layer 103 has a thickness of 1.5 μm. An n-type $Al_{0.02}Ga_{0.98}N$ cladding layer 205 is provided on the n-type GaN contact layer 103. The n-type $Al_{0.02}Ga_{0.98}N$ cladding layer 205 is doped with Si. The n-type $Al_{0.02}Ga_{0.98}N$ cladding layer 205 has a thickness of 1 μm. An n-type GaN optical guide layer 106 is provided on the n-type $Al_{0.02}Ga_{0.98}N$ cladding layer 205. The n-type GaN optical guide layer 106 is doped with Si. The n-type GaN optical guide layer 106 has a thickness of 0.1 μm. A multiple quantum well active layer 807 is provided on the n-type GaN optical guide layer 106. The multiple quantum well active layer 807 comprises 7 periods of alternating laminations of undoped $In_{0.2}Ga_{0.8}N$ quantum well layers having a thickness of 25 Å and undoped $In_{0.05}Ga_{0.95}N$ barrier layers having a thickness of 50 Å. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppression of dissociation and evaporation of indium from the undoped $In_{0.2}Ga_{0.8}N$ quantum well layers or the undoped $In_{0.05}Ga_{0.95}N$ barrier layers. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 μm. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $Al_{0.7}Ga_{0.93}N$ cladding layer 810 has a thickness of 0.4 μm. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 μm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises laminations of a titanium layer and an aluminum layer.

Figure 14:
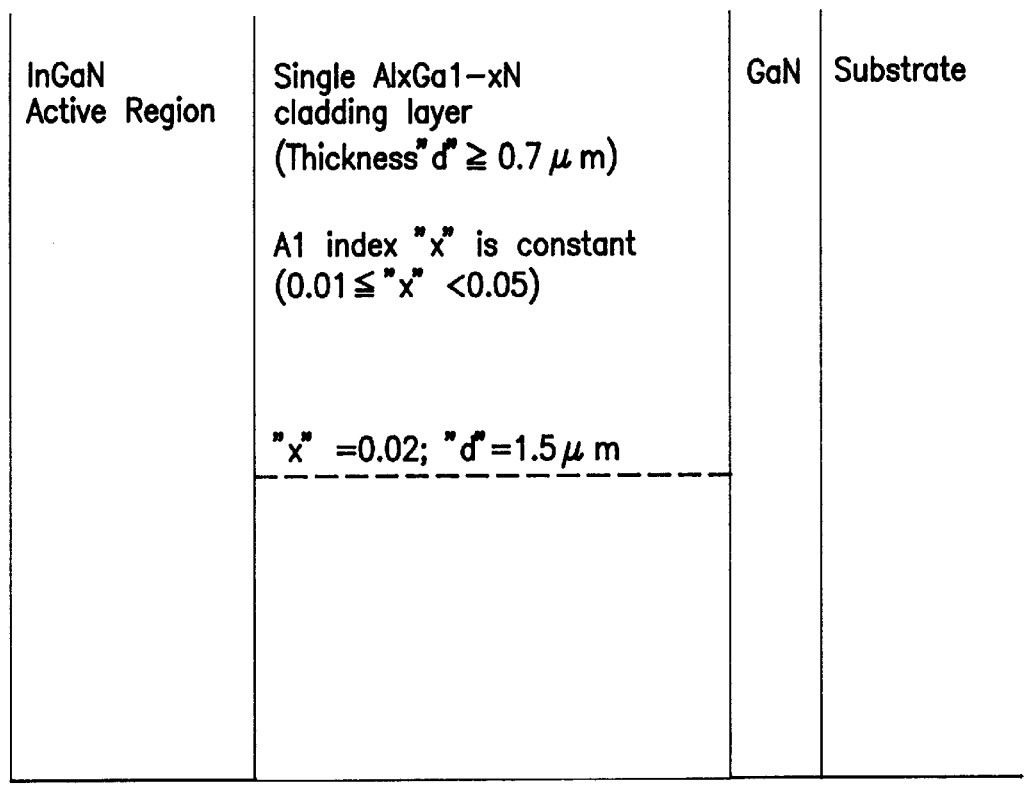
FIG. 14 is a diagram illustrative of a profile of an aluminum index "x" of the n-type $Al_{0.02}Ga_{0.968}N$ cladding layer 205 having a thickness of 1.5 μm in a second embodiment according to the present invention.

FIG. 14 is a diagram illustrative of a profile of an aluminum index "x" of the n-type $Al_{0.02}Ga_{0.968}N$ cladding layer 205 having a thickness of 1.5 μm. As shown in FIG. 14, the aluminum index "x" of the n-type $Al_{0.02}Ga_{0.98}N$ cladding layer 205 is kept contact at 0.02. Namely, the averaged value of the index "x" of aluminum of the above $Al_{0.02}Ga_{0.98}N$ layer is suppressed low values, for example, in the range of not less than 0.01 to less than 0.05, so as to suppress any crack to appear in the cladding layer. It is therefore unnecessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above $Al_{0.02}Ga_{0.98}N$ cladding layer makes the cladding layer decrease in optical confinement into the active region, whilst the increase in total thickness of the above $Al_{0.02}Ga_{0.98}N$ layer makes the cladding layer increase in optical confinement into the active region. The total thickness of the above $Al_{0.02}Ga_{0.98}N$ layer is 1 micrometer which is larger than 0.7 micrometers.

Figure 15:
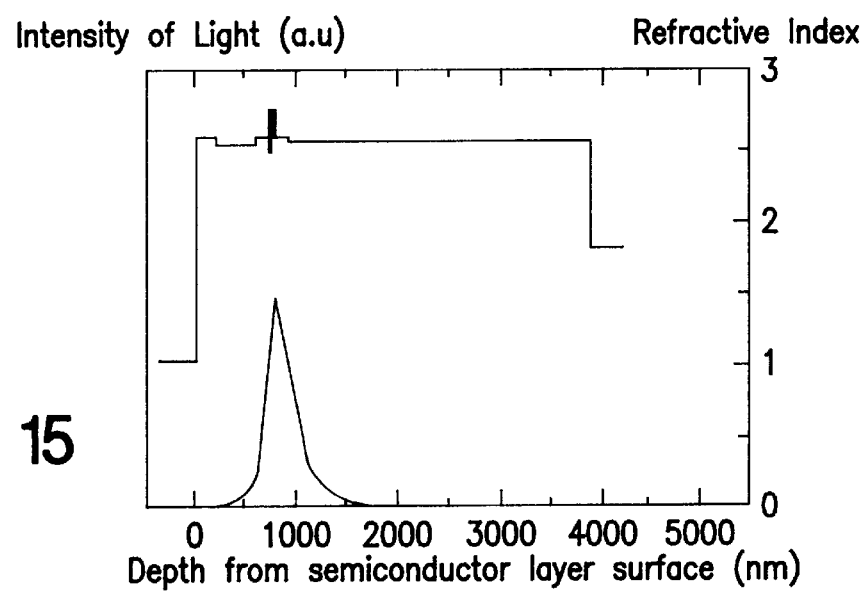
FIG. 15 is a graph illustrative of optical intensity and refractive index versus a depth from the surface of the semiconductor layer in a second embodiment according to the present invention.

FIG. 15 is a graph illustrative of optical intensity and refractive index versus a depth from the surface of the semiconductor layer. The optical intensity is obtained by such a calculation of an optical distribution in the first order mode that a total value of confinement coefficients into individual quantum well layers in transverse electric mode (TE-mode) becomes maximum. The above improved cladding layer 205 provides a sufficiently large optical confinement into the active region including the active layer 807 and the optical guide layer 106 without optical dispersion into the cladding layer 205 and the GaN contact layer 103.

Accordingly, the above improved cladding layer 205 is capable of not only providing a sufficiently large optical confinement into the active region but also avoiding the crack in the cladding layer 205.

THIRD EMBODIMENT

A third embodiment according to the present invention will be described in detail with reference to FIG. 16 which is a fragmentary cross sectional elevation view illustrative of a gallium nitride based semiconductor laser device. The gallium nitride based semiconductor laser device is formed on a (11-20)-face of a sapphire substrate 501. An undoped GaN buffer layer 102 is provided on the (11-20)-face of the sapphire substrate 501. The undoped GaN buffer layer 102 has a thickness of 500 Å. An n-type GaN contact layer 103 is provided on the undoped GaN buffer layer 102. The n-type GaN contact layer 103 is doped with Si. The n-type GaN contact layer 103 has a thickness of 0.5 μm. An n-type $Al_{0.02}Ga_{0.98}N$ cladding layer 205 is provided on the n-type GaN contact layer 103. The n-type $Al_{0.02}Ga_{0.98}N$ cladding layer 205 is doped with Si. The n-type $Al_{0.02}Ga_{0.98}N$ cladding layer 205 has a thickness of 1 μm. An n-type GaN optical guide layer 106 is provided on the n-type $Al_{0.02}Ga_{0.98}N$ cladding layer 205. The n-type GaN optical glide layer 106 is doped with Si. The n-type GaN optical guide layer 106 has a thickness of 0.1 μm. A multiple quantum well active layer 807 is provided on the n-type GaN optical guide layer 106. The multiple quantum well active layer 807 comprises 7 periods of alternating laminations of undoped $In_{0.2}Ga_{0.8}N$ quantum well layers having a thickness of 25 Å and undoped $In_{0.05}Ga_{0.95}N$ barrier layers having a thickness of 50 Å. A p-type $Al_{0.2}Ga_{0.8}N$ layer 108 is provided on the multiple quantum well active layer 807. The p-type $Al_{0.2}Ga_{0.8}N$ layer 18 is doped with Mg. The p-type $Al_{0.2}Ga_{0.8}N$ layer 108 has a thickness of 200 Å. The p-type $Al_{0.2}Ga_{0.8}N$ layer 108 is capable of suppression of dissociation and evaporation of indium from the undoped $In_{0.2}Ga_{0.8}N$ quantum well layers or the undoped $In_{0.05}Ga_{0.95}N$ barrier layers. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 μm. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $A_{0.07}Ga_{0.93}N$ cladding layer 810 has a thickness of 0.4 μm. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 μm. A p-electrode 112 is provided on the p-type GaN contact layer 111. The p-electrode 112 comprises laminations of a nickel layer and a gold layer. An n-electrode 113 is provided on a part of the n-type $Al_{0.04}Ga_{0.96}N$ cladding layer 105. The n-electrode 113 comprises laminations of a titanium layer and an aluminum layer.

Figures 16, 17:
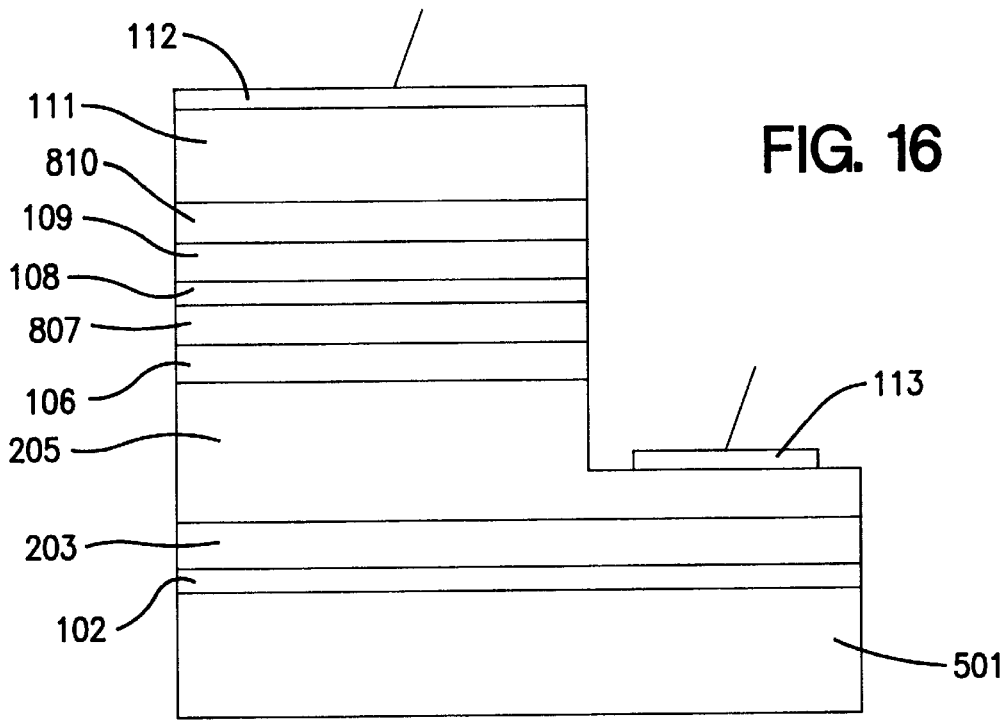
FIG. 16 is a fragmentary cross sectional elevation view illustrative of a gallium nitride based semiconductor laser device in a third embodiment according to the present invention.
FIG. 17 is a diagram illustrative of a profile of an aluminum index "x" of the n-type $Al_{0.02}Ga_{0.98}N$ cladding layer 205 having a thickness of 1.5 μm in a third embodiment according to the present invention.

FIG. 17 is a diagram illustrative of a profile of an aluminum index "x" of the n-type $Al_{0.02}Ga_{0.98}N$ cladding layer 205 having a thickness of 1.5 μm. As shown in FIG. 17, the aluminum index "x" of the n-type $Al_{0.02}Ga_{0.98}N$ cladding layer 205 is kept contact at 0.02. Namely, the averaged value of the index "x" of aluminum of the above $Al_{0.02}Ga_{0.98}N$ layer is suppressed low values, for example, in the range of not less than 0.01 to less than 0.05, so as to suppress any crack to appear in the cladding layer. It is therefore unnecessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above $Al_{0.02}Ga_{0.98}N$ cladding layer makes the cladding layer decrease in optical confinement into the active region, whilst the increase in total thickness of the above $Al_{0.02}Ga_{0.98}N$ layer makes the cladding layer increase in optical confinement into the active region. The total thickness of the above $Al_{0.02}Ga_{0.98}N$ layer is 1 micrometer which is larger than 0.7 micrometers.

Figure 18:
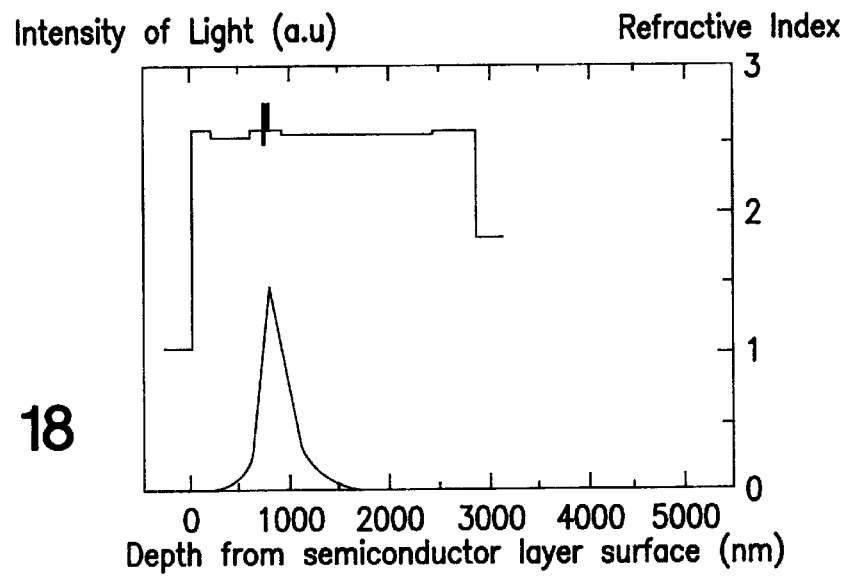
FIG. 18 is a graph illustrative of optical intensity and refractive index versus a depth from the surface of the semiconductor layer in a third embodiment according to the present invention.

FIG. 18 is a graph illustrative of optical intensity and refractive index versus a depth from the surface of the semiconductor layer. The optical intensity is obtained by such a calculation of an optical distribution in the first order mode that a total value of confinement coefficients into individual quantum well layers in transverse electric mode (TE-mode) becomes maximum. The above improved cladding layer 205 provides a sufficiently large optical confinement into the active region including the active layer 807 and the optical guide layer 106 without optical dispersion into the cladding layer 205 and the GaN contact layer 103.

Accordingly, the above improved cladding layer 205 is capable of not only providing a sufficiently large optical confinement into the active region but also avoiding the crack in the cladding layer 205.

Further, the cladding layer 205 having a thickness of 1.5 micrometers is in contact with the n-electrode. There is raised no substantive problem with the increase in contact resistance of the electrode because $Al_{0.02}Ga_{0.98}N$ has almost no difference in energy band gap from gallium nitride. The gallium nitride contact layer 203 between the cladding layer 205 and the substrate 501 has a reduced thickness of 0.5 micrometers. Since the aluminum gallium nitride cladding layer 205 may also play the same roll as the contact layer, it is possible to reduce the thickness of the gallium nitride contact layer 203. This results in reduction in a total thickness of the semiconductor layers. This further reduces a probability of generation of crack in those semiconductor layers.

FOURTH EMBODIMENT

Figure 19:
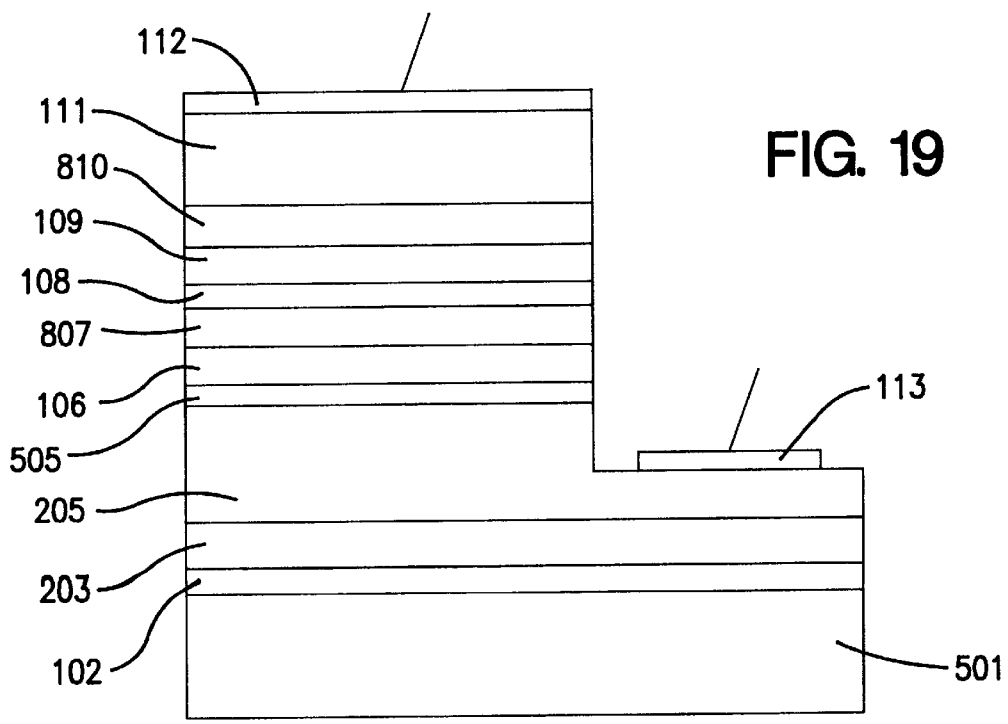
FIG. 19 is a fragmentary cross sectional elevation view illustrative of a gallium nitride based semiconductor laser device in a fourth embodiment according to the present invention.

A fourth embodiment according to the present invention will be described in detail with reference to FIG. 19 which is a fragmentary cross sectional elevation view illustrative of a gallium nitride based semiconductor laser device. The gallium nitride based semiconductor laser device is formed on a (11-20)-face of a sapphire substrate 501. An undoped GaN buffer layer 102 is provided on the (11-20)-face of the sapphire substrate 501. The undoped GaN buffer layer 102 has a thickness of 500 Å. An a-type GaN contact layer 103 is provided on the undoped GaN buffer layer 102. The n-type GaN contact layer 103 is doped with Si. The n-type GaN contact layer 103 has a thickness of 0.5 μm. An n-type $Al_{0.02}Ga_{0.98}N$ cladding layer 205 is provided on the n-type GAN contact layer 103. The n-type $Al_{0.02}Ga_{0.98}N$ cladding layer 205 is doped with Si. The n-type $Al_{0.02}Ga_{0.98}N$ cladding layer 205 has a thickness of 1 μm. An n-type $Al_{0.07}Ga_{0.93}N$ cladding layer 505 is further provided on the n-type $Al_{0.02}Ga_{0.98}N$ cladding layer 205. The n-type $Al_{0.07}Ga_{0.93}N$ cladding layer 505 is doped with Si. The n-type $Al_{0.07}Ga_{0.93}N$ cladding layer 505 has a thickness of 0.4 μm. An n-type GaN optical guide layer 106 is provided on the n-type $Al_{0.07}Ga_{0.93}N$ cladding layer 505. The n-type GaN optical guide layer 106 is doped with Si. The n-type GaN optical guide layer 106 has a thickness of 0.1 μm. A multiple quantum well active layer 807 is provided on the n-type GaN optical guide layer 106. The multiple quantum well active layer 807 comprises 7 periods of alternating laminations of undoped $In_{0.2}Ga_{0.8}N$ quantum well layers having a thickness of 25 Å and undoped $In_{0.05}Ga_{0.95}N$ barrier layers having a thickness of 50 Å. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppression of dissociation and evaporation of indium from the undoped $In_{0.2}Ga_{0.8}N$ quantum well layers or the undoped $In_{0.05}Ga_{0.95}N$ barrier layers. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 μm. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $Al_{0.07}Ga_{0.93}N$ cladding layer 810 has a thickness of 0.4 μm. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 μm. A p-electrode 112 is provided on the p-type GaN contact layer 111. The p-electrode 112 comprises laminations of a nickel layer and a gold layer. An n-electrode 113 is provided on a part of the n-type $Al_{0.04}Ga_{0.96}N$ cladding layer 105. The n-electrode 113 comprises laminations of a titanium layer and an aluminum layer.

Figure 20:
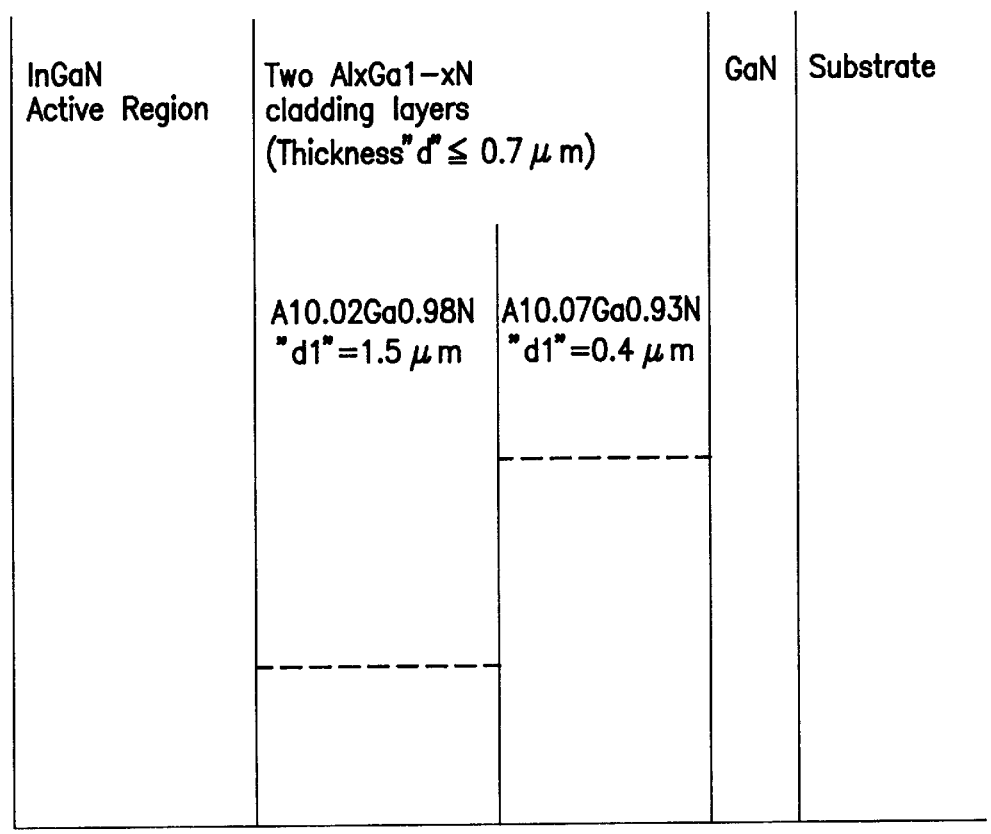
FIG. 20 is a diagram illustrative of a profile of an aluminum index "x" of the n-type $Al_{0.04}Ga_{0.96}N$ cladding layer 105 having a thickness of 1.5 μm and the n-type $Al_{0.07}Ga_{0.93}N$ cladding layer 505 having a thickness of 0.4 μm in a fourth embodiment according to the present invention.

FIG. 20 is a diagram illustrative of a profile of an aluminum index "x" of the n-type $Al_{0.04}Ga_{0.96}N$ cladding layer 105 having a thickness of 1.5 μm and the n-type $Al_{0.07}Ga_{0.93}N$ cladding layer 505 having a thickness of 0.4 μm. As shown in FIG. 20, the aluminum index "x" of the n-type $Al_{0.02}Ga_{0.98}N$ cladding layer 205 is kept contact at 0.02 whilst the n-type $Al_{0.07}Ga_{0.93}N$ cladding layer 505 is kept contact at 0.07. Namely, the averaged value of the index "x" of aluminum of the above $Al_{0.02}Ga_{0.98}N$ layer and the n-type $Al_{0.07}Ga_{0.93}N$ cladding layer 505 is suppressed low values, for example, in the range of not less than 0.01 to less than 0.05, so as to suppress any crack to appear in the cladding layer. It is therefore unnecessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above $Al_{0.02}Ga_{0.98}N$ cladding layer makes the cladding layer decrease in optical confinement into the active region, whilst the increase in total thickness of the above $Al_{0.02}Ga_{0.98}N$ layer makes the cladding layer increase in optical confinement into the active region. The total thickness of the above $Al_{0.02}Ga_{0.98}N$ layer and the n-type $Al_{0.07}Ga_{0.93}N$ cladding layer 505 is 1.9 micrometer which is larger than 0.7 micrometers.

Figure 21:
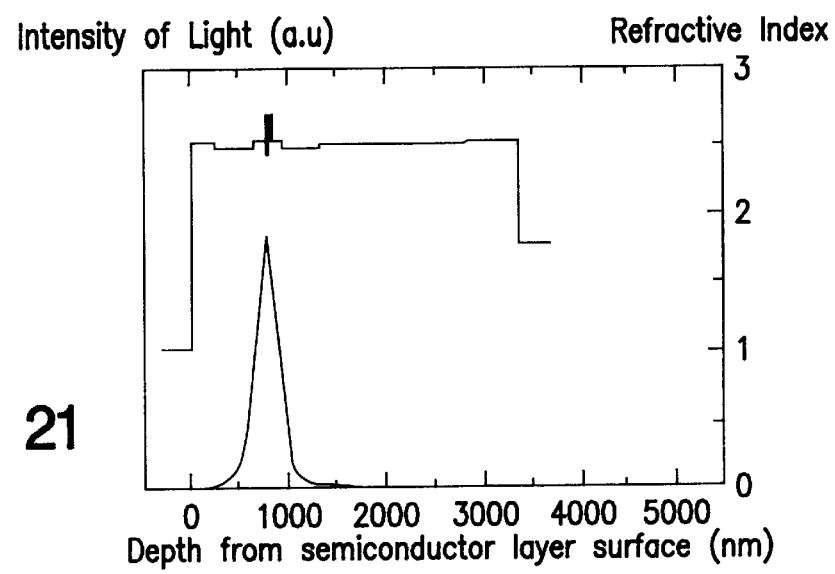
FIG. 21 is a graph illustrative of optical intensity and refractive index versus a depth from the surface of the semiconductor layer in a fourth embodiment according to the present invention.

FIG. 21 is a graph illustrative of optical intensity and refractive index versus a depth from the surface of the semiconductor layer. The optical intensity is obtained by such a calculation of an optical distribution in the first order mode that a total value of confinement coefficients into individual quantum well layers in transverse electric mode (TE-mode) becomes maximum. The above improved cladding layer provides a sufficiently large optical confinement into the active region including the active layer 807 and the optical guide layer 106 without optical dispersion into the cladding layer and the GaN contact layer 103.

Accordingly, the above improved cladding layer is capable of not only providing a sufficiently large optical confinement into the active region but also avoiding the crack in the cladding layer.

Further, the cladding layer 205 having a thickness of 1.5 micrometers is in contact with the n-electrode. There is raised no substantive problem with the increase in contact resistance of the electrode because $Al_{0.02}Ga_{0.98}N$ has almost no difference in energy band gap from gallium nitride. The gallium nitride contact layer 203 between the cladding layer 205 and the substrate 501 has a reduced thickness of 0.5 micrometers. Since the aluminum gallium nitride cladding layer 205 may also play the same roll as the contact layer, it is possible to reduce the thickness of the gallium nitride contact layer 203. This results in reduction in a total thickness of the semiconductor layers. This further reduces a probability of generation of crack in those semiconductor layers.

FIFTH EMBODIMENT

Figure 22:
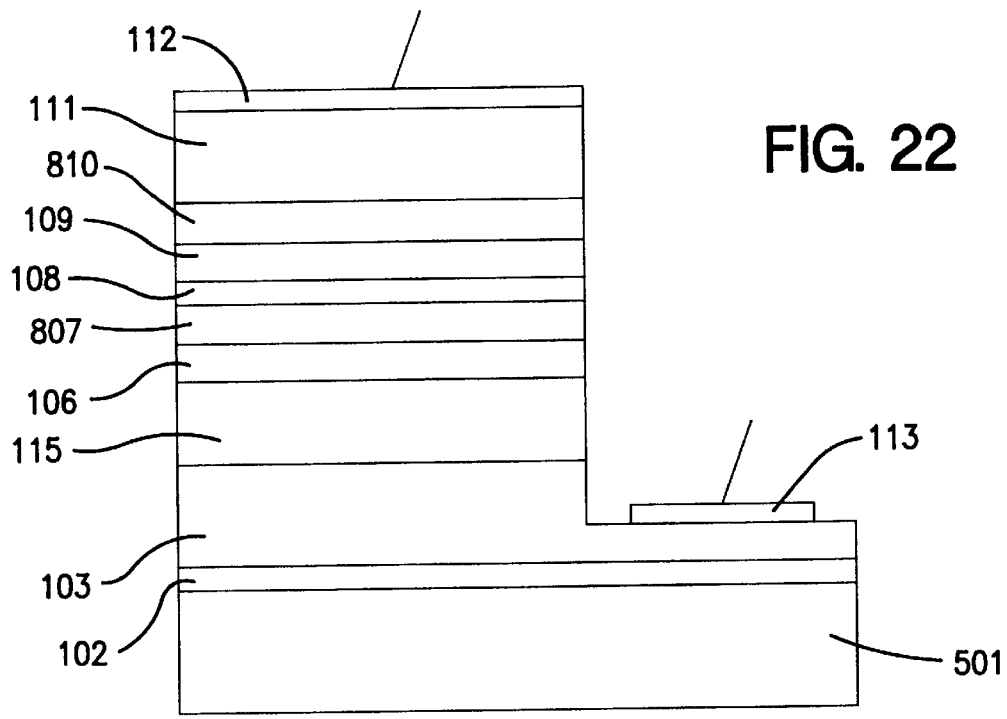
FIG. 22 which is a fragmentary cross sectional elevation view illustrative of a gallium nitride based semiconductor laser device in a fifth embodiment according to the present invention.

A fifth embodiment according to the present invention will be described in detail with reference to FIG. 22 which is a fragmentary cross sectional elevation view illustrative of a gallium nitride based semiconductor laser device. The gallium nitride based semiconductor laser device is formed on a (11-20)-face of a sapphire substrate 501. An undoped GaN buffer layer 102 is provided on the (11-20)-face of the sapphire substrate 501. The undoped GaN buffer layer 102 has a thickness of 500 Å. An n-type GaN contact layer 103 is provided on the undoped GaN buffer layer 102. The n-type GaN contact layer 103 is doped with Si. The n-type GaN contact layer 103 has a thickness of 1.5 $\mu$m. An n-type $Al_xGa_{1-x}N$ cladding layer 115 is provided on the n-type GaN contact layer 103. An aluminum index "x" is proportionally increased in a direction toward the substrate 501 so that an averaged value of the aluminum index "x" of the $Al_xGa_{1-x}N$ cladding layer 115 is in the range of not less than 0.01 to less than 0.05. The n-type $Al_xGa_{1-x}N$ cladding layer 115 is doped with Si. The n-type $Al_xGa_{1-x}N$ cladding layer 115 has a thickness of 1 $\mu$m. An n-type GaN optical guide layer 106 is provided on the n-type $Al_xGa_{1-x}N$ cladding layer 115. The n-type GaN optical guide layer 106 is doped with Si. The n-type GaN optical guide layer 106 has a thickness of 0.1 $\mu$m. A multiple quantum well active layer 807 is provided on the n-type GaN optical guide layer 106. The multiple quantum well active layer 807 comprises 7 periods of alternating laminations of undoped $In_{0.2}Ga_{0.8}N$ quantum well layers having a thickness of 25 Å and undoped $In_{0.05}Ga_{0.95}N$ barrier layers having a thickness of 50 Å. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppression of dissociation and evaporation of indium from the undoped $In_{0.2}Ga_{0.8}N$ quantum well layers or the undoped $In_{0.5}Ga_{0.95}N$ barrier layers. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 $\mu$m. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $Al_{0.07}Ga_{0.93}N$ cladding layer 810 has a thickness of 0.4 $\mu$m. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 $\mu$m. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises laminations of a titanium layer and an aluminum layer.

Figure 23:
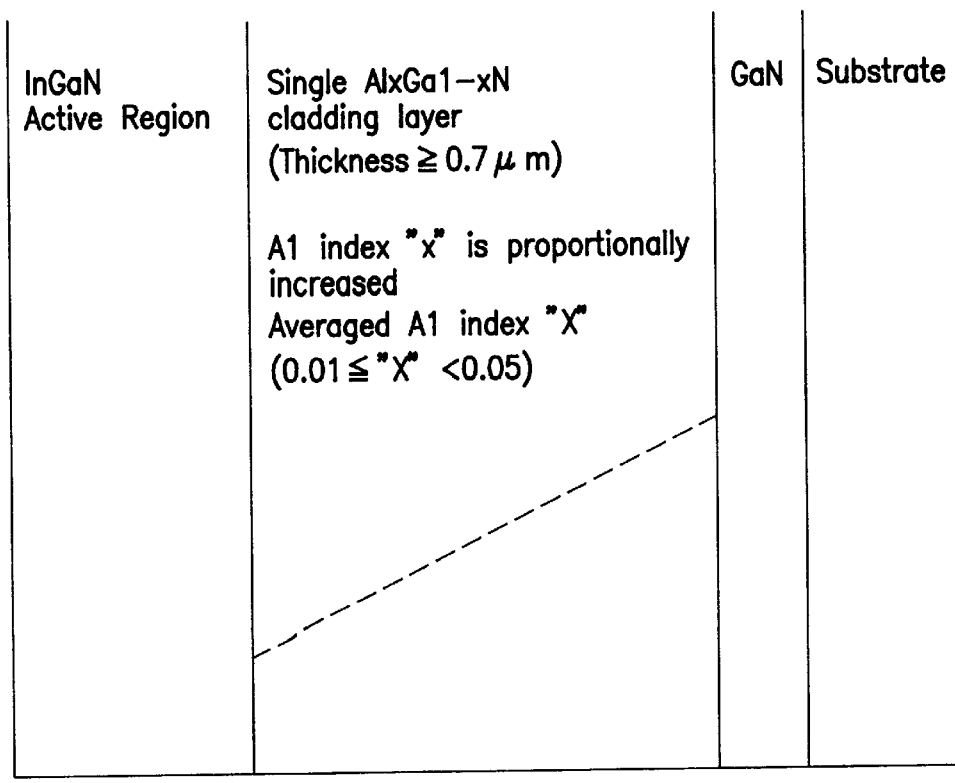
FIG. 23 is a diagram illustrative of a profile of an aluminum index "x" of the n-type $Al_{0.04}Ga_{0.96}N$ cladding layer 115 having a thickness of 1 μm in a fifth embodiment according to the present invention.

FIG. 23 is a diagram illustrative of a profile of an aluminum index "x" of the n-type $Al_{0.04}Ga_{0.96}N$ cladding layer 115 having a thickness of 1 $\mu$m. As shown in FIG. 23, the aluminum index "x" of the n-type $Al_{0.04}Ga_{0.96}N$ cladding layer 115 is proportionally increased in a direction toward the substrate 501 so that an averaged value of the aluminum index "x" of the $Al_xGa_{1-x}N$ cladding layer 115 is in the range of not less than 0.01 to less than 0.05. Namely, the averaged value of the index "x" of aluminum of the above $Al_xGa_{1-x}N$ layer is suppressed low values, for example, in the range of not less than 0.01 to less than 0.05, so as to suppress any crack to appear in the cladding layer. It is therefore unnecessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above $Al_xGa_{1-x}N$ cladding layer makes the cladding layer decrease in optical confinement into the active region, whilst the increase in total thickness of the above $Al_xGa_{1-x}N$ layer makes the cladding layer increase in optical confinement into the active region. The total thickness of the above $Al_xGa_{1-x}N$ layer is 1 micrometer which is larger than 0.7 micrometers.

The above improved cladding layer 115 provides a sufficiently large optical confinement into the active region including the active layer 807 and the optical guide layer 106 without optical dispersion into the cladding layer 115 and the GaN contact layer 103.

Accordingly, the above improved cladding layer 115 is capable of not only providing a sufficiently large optical confinement into the active region but also avoiding the crack in the cladding layer 115.

SIXTH EMBODIMENT

Figure 24:
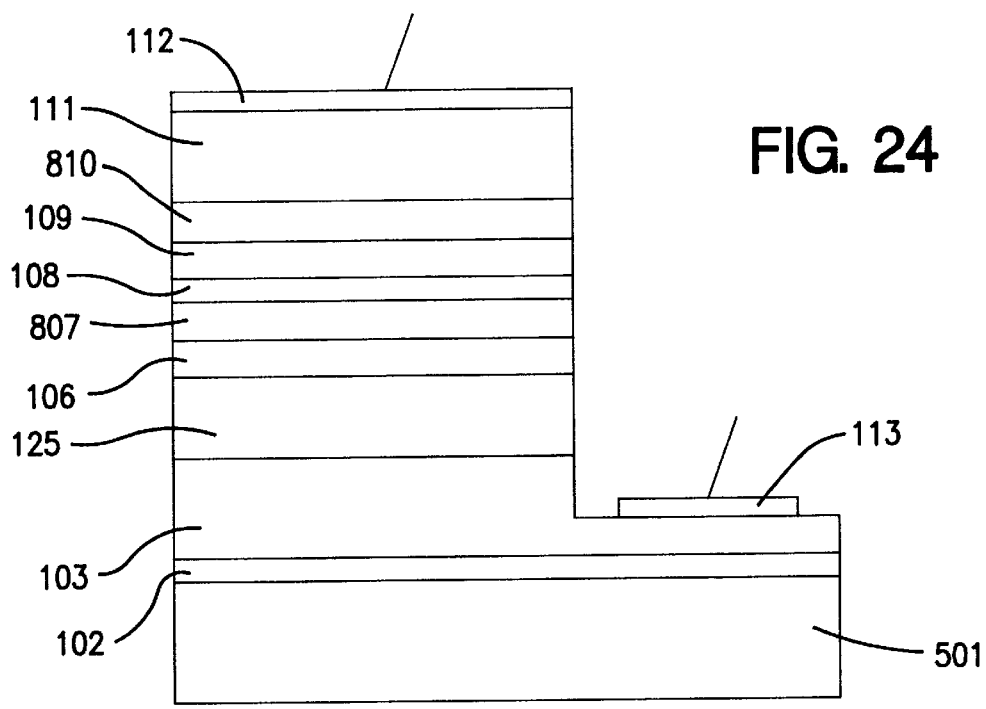
FIG. 24 which is a fragmentary cross sectional elevation view illustrative of a gallium nitride based semiconductor laser device in a sixth embodiment according to the present invention.

A sixth embodiment according to the present invention will be described in detail with reference to FIG. 24 which is a fragmentary cross sectional elevation view illustrative of a gallium nitride based semiconductor laser device. The gallium nitride based semiconductor laser device is formed on a (11-20)-face of a sapphire substrate 501. An undoped GaN buffer layer 102 is provided on the (11-20)-face of the sapphire substrate 501. The undoped GaN buffer layer 102 has a thickness of 500 Å. An n-type GaN contact layer 103 is provided on the undoped GaN buffer layer 102. The n-type GaN contact layer 103 is doped with Si. The n-type GaN contact layer 103 has a thickness of 1.5 μm. An n-type $Al_xGa_{1-x}N$ cladding layer 125 is provided on the n-type GaN contact layer 103. An aluminum index "x" is step-like increased in a direction toward the substrate 501 so that an averaged value of the aluminum index "x" of the $Al_xGa_{1-x}N$ cladding layer 125 is in the range of not less than 0.01 to less than 0.05. The n-type $Al_xGa_{1-x}N$ cladding layer 125 is doped with Si. The n-type $Al_xGa_{1-x}N$ cladding layer 125 has a thickness of 1 μm. An n-type GaN optical guide layer 106 is provided on the n-type $Al_xGa_{1-x}N$ cladding layer 125. The n-type GaN optical guide layer 106 is doped with Si. The n-type GaN optical guide layer 106 has a thickness of 0.1 μm. A multiple quantum well active layer 807 is provided on the n-type GaN optical guide layer 106. The multiple quantum well active layer 807 comprises 7 periods of alternating laminations of undoped $In_{0.2}Ga_{0.8}N$ quantum well layers having a thickness of 25 Å and undoped $In_{0.05}Ga_{0.95}N$ barrier layers having a thickness of 50 Å. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppression of dissociation and evaporation of indium from the undoped $In_{0.2}Ga_{0.8}N$ quantum well layers or the undoped $In_{0.05}Ga_{0.95}N$ barrier layers. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 μm. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $Al_{0.07}Ga_{0.93}N$ cladding layer 810 has a thickness of 0.4 μm. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 μm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises laminations of a titanium layer and an aluminum layer.

Figure 25:
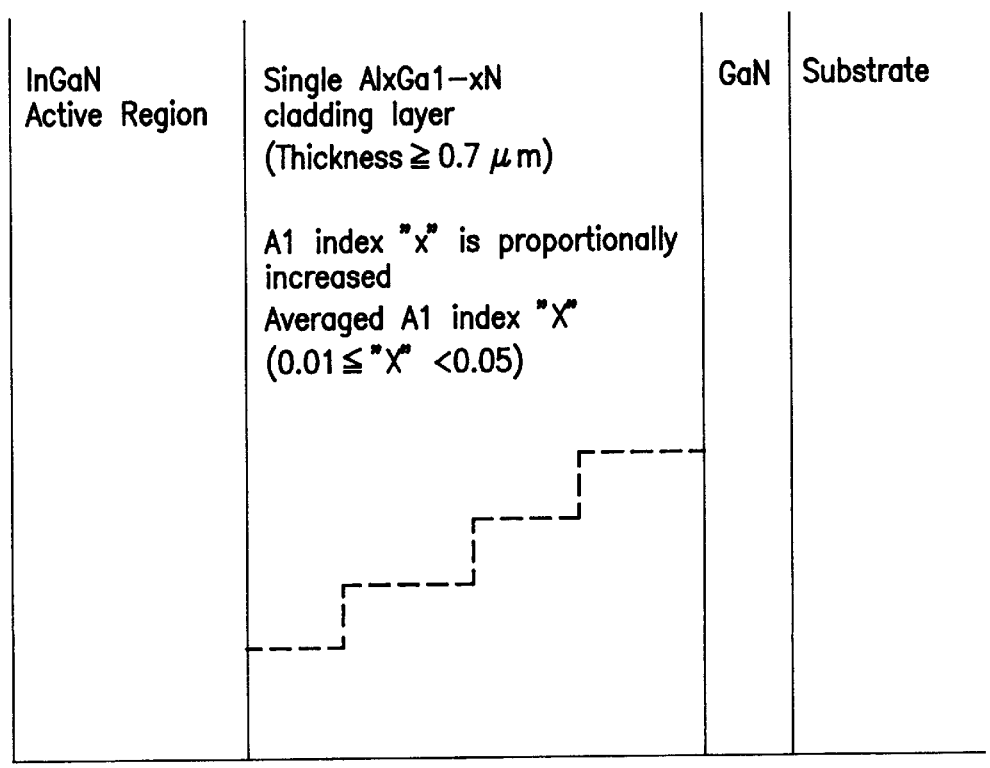
FIG. 25 is a diagram illustrative of a profile of an aluminum index "x" of the n-type $Al_{0.04}Ga_{0.96}N$ cladding layer 125 having a thickness of 1 μm in a sixth embodiment according to the present invention.

FIG. 25 is a diagram illustrative of a profile of an aluminum index "x" of the n-type $Al_{0.04}Ga_{0.96}N$ cladding layer 125 having a thickness of 1 μm. As shown in FIG. 25, the aluminum index "x" of the n-type $Al_{0.04}Ga_{0.96}N$ cladding layer 125 is step-like increased in a direction toward the substrate 501 so that an averaged value of the aluminum index "x" of the $Al_xGa_{1-x}N$ cladding layer 125 is in the range of not less than 0.01 to less than 0.05. Namely, the averaged value of the index "x" of aluminum of the above $Al_xGa_{1-x}N$ layer is suppressed low values, for example, in the range of not less than 0.01 to less than 0.05, so as to suppress any crack to appear in the cladding layer. It is therefore unnecessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above $Al_xGa_{1-x}N$ cladding layer makes the cladding layer decrease in optical confinement into the active region, whilst the increase in total thickness of the above $Al_xGa_{1-x}N$ layer makes the cladding layer increase in optical confinement into the active region. The total thickness of the above $Al_xGa_{1-x}N$ layer is 1 micrometer which is larger than 0.7 micrometers.

The above improved cladding layer 125 provides a sufficiently large optical confinement into the active region including the active layer 807 and the optical guide layer 106 without optical dispersion into the cladding layer 125 and the GaN contact layer 103.

Accordingly, the above improved cladding layer 125 is capable of not only providing a sufficiently large optical confinement into the active region but also avoiding the crack in the cladding layer 125.

SEVENTH EMBODIMENT

Figure 26:
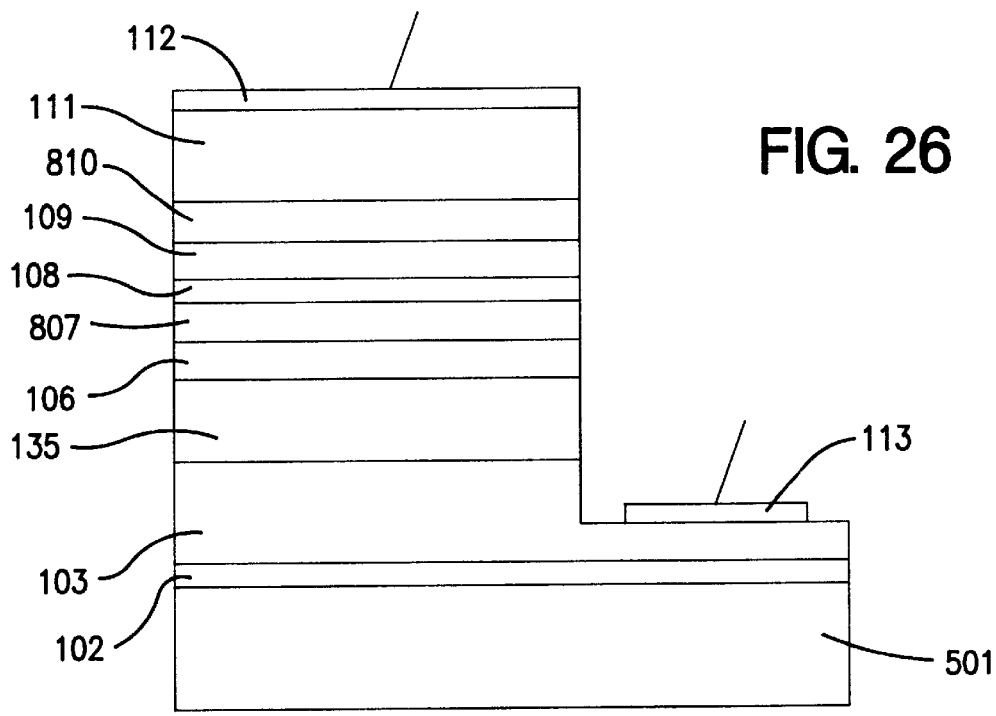
FIG. 26 which is a fragmentary cross sectional elevation view illustrative of a gallium nitride based semiconductor laser device in a seventh embodiment according to the present invention.

A seventh embodiment according to the present invention will be described in detail with reference to FIG. 26 which is a fragmentary cross sectional elevation view illustrative of a gallium nitride based semiconductor laser device. The gallium nitride based semiconductor laser device is formed on a (11-20)-face of a sapphire substrate 501. An undoped GaN buffer layer 102 is provided on the (11-20)-face of the sapphire substrate 501. The undoped GaN buffer layer 102 has a thickness of 500 Å. An n-type GaN contact layer 103 is provided on the undoped GaN buffer layer 102. The n-type GaN contact layer 103 is doped with Si. The n-type GaN contact layer 103 has a thickness of 1.5 μm. An n-type $Al_xGa_{1-x}N$ cladding layer 135 is provided on the n-type GaN contact layer 103. An aluminum index "x" is varied to increase and then decrease in a direction toward the substrate 501 so as to have a curved profile of the aluminum index "x", provided that an averaged value of the aluminum index "x" of the $Al_xGa_{1-x}N$ cladding layer 135 is in the range of not less than 0.01 to less than 0.05. The n-type $Al_xGa_{1-x}N$ cladding layer 135 is doped with Si. The n-type $Al_xGa_{1-x}N$ cladding layer 135 has a thickness of 1 μm. An n-type GaN optical guide layer 106 is provided on the n-type $Al_xGa_{1-x}N$ cladding layer 135. The n-type GaN optical guide layer 106 is doped with Si. The n-type GaN optical guide layer 106 has a thickness of 0.1 μm. A multiple quantum well active layer 807 is provided on the n-type GaN optical guide layer 106. The multiple quantum well active layer 807 comprises 7 periods of alternating laminations of undoped $In_{0.2}Ga_{0.8}N$ quantum well layers having a thickness of 25 Å and undoped $In_{0.05}Ga_{0.95}N$ barrier layers having a thickness of 50 Å. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppression of dissociation and evaporation of indium from the undoped $In_{0.2}Ga_{0.8}N$ quantum well layers or the undoped $In_{0.05}Ga_{0.95}N$ barrier layers. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 μm. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $Al_{0.07}Ga_{0.93}N$ cladding layer 810 has a thickness of 0.4 μm. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 μm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises laminations of a titanium layer and an aluminum layer.

Figure 27:
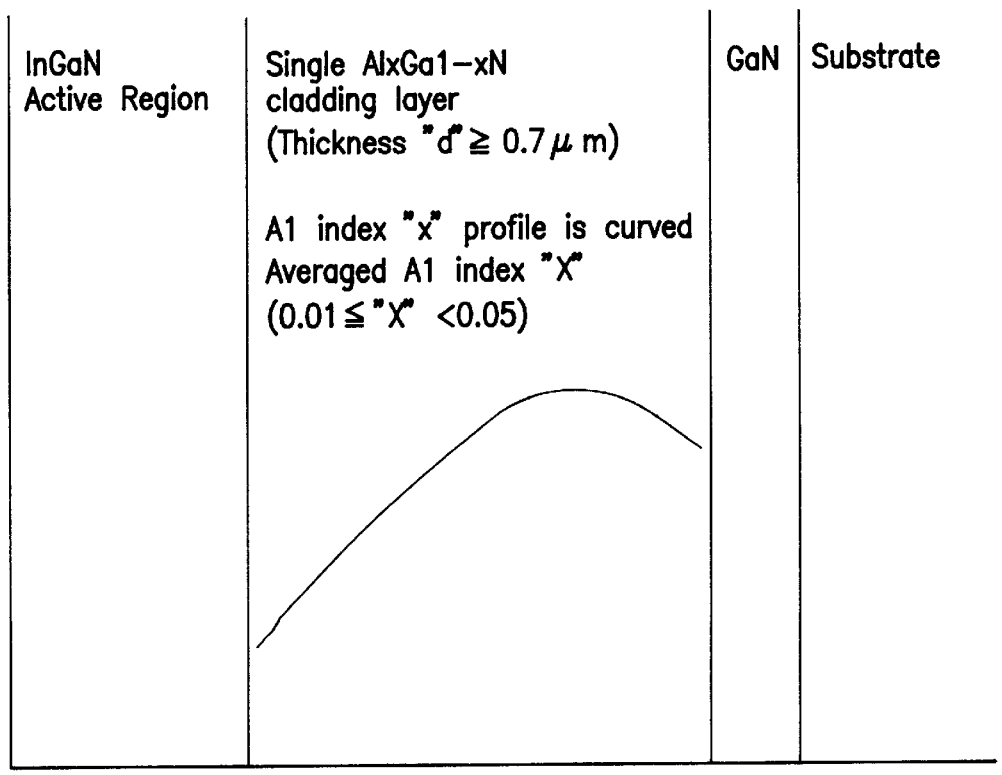
FIG. 27 is a diagram illustrative of a profile of an aluminum index "x" of the n-type $Al_{0.04}Ga_{0.96}N$ cladding layer 135 having a thickness of 1 μm in a seventh embodiment according to the present invention.

FIG. 27 is a diagram illustrative of a profile of an aluminum index "x" of the n-type $Al_{0.04}Ga_{0.96}N$ cladding layer 135 having a thickness of 1 μm. As shown in FIG. 27, the aluminum index "x" of the n-type $Al_{0.04}Ga_{0.96}N$ cladding layer 135 is varied to increase and then decrease in a direction toward the substrate 501 so as to have a curved profile of the aluminum index "x", provided that an averaged value of the aluminum index "x" of the $Al_xGa_{1-x}N$ cladding layer 135 is in the range of not less than 0.01 to less than 0.05. Namely, the averaged value of the index "x" of aluminum of the above $Al_xGa_{1-x}N$ layer is suppressed low values, for example, in the range of not less than 0.01 to less than 0.05, so as to suppress any crack to appear in the cladding layer. It is therefore unnecessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above $Al_xGa_{1-x}N$ cladding layer makes the cladding layer decrease in optical confinement into the active region, whilst the increase in total thickness of the above $Al_xGa_{1-x}N$ layer makes the cladding layer increase in optical confinement into the active region. The total thickness of the above $Al_xGa_{1-x}N$ layer is 1 micrometer which is larger than 0.7 micrometers.

The above improved cladding layer 135 provides a sufficiently large optical confinement into the active region including the active layer 807 and the optical guide layer 106 without optical dispersion into the cladding layer 135 and the GaN contact layer 103.

Accordingly, the above improved cladding layer 135 is capable of not only providing a sufficiently large optical confinement into the active region but also avoiding the crack in the cladding layer 135.

EIGHTH EMBODIMENT

An eighth embodiment according to the present invention will be described in detail with reference to FIG. 28 which is a fragmentary cross sectional elevation view illustrative of a gallium nitride based semiconductor laser device. The gallium nitride based semiconductor laser device is formed on a (11-20)-face of a sapphire substrate 501. An undoped GaN buffer layer 102 is provided on the (11-20)-face of the sapphire substrate 501. The undoped GaN buffer layer 102 has a thickness of 500 Å. An n-type GaN contact layer 103 is provided on the undoped GaN buffer layer 102. The n-type GaN contact layer 103 is doped with Si. The n-type GaN contact layer 103 has a thickness of 1.5 μm. A cladding layer 145 is provided on the n-type GaN contact layer 103. The cladding layer 145 comprises two n-type $Al_{0.04}Ga_{0.96}N$ layers having a thickness of 0.6 micrometers which is separated by an intermediate InGaN layer having a thickness of 0.1 micrometer. An aluminum index "x" of the two n-type $Al_{0.04}Ga_{0.96}N$ layers is constant at 0.04 so that an averaged value of the aluminum index "x" of the two n-type $Al_{0.04}Ga_{0.96}N$ layers and the intermediate InGaN layer is in the range of not less than 0.01 to less than 0.05. The cladding layer 145 is doped with Si. The cladding layer 145 has a total thickness of 1.3 μm. An n-type GaN optical guide layer 106 is provided on the cladding layer 145. The n-type GaN optical guide layer 106 is doped with Si. The n-type GaN optical guide layer 106 has a thickness of 0.1 μm. A multiple quantum well active layer 807 is provided on the n-type GaN optical guide layer 106. The multiple quantum well active layer 807 comprises 7 periods of alternating laminations of undoped $In_{0.2}Ga_{0.8}N$ quantum well layers having a thickness of 25 Å and undoped $In_{0.05}Ga_{0.95}N$ barrier layers having a thickness of 50 Å. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppression of dissociation and evaporation of indium from the undoped $In_{0.2}Ga_{0.8}N$ quantum well layers or the undoped $In_{0.05}Ga_{0.95}N$ barrier layers. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 μm. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $Al_{0.07}Ga_{0.93}N$ cladding layer 810 has a thickness of 0.4 μm. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 μm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises laminations of a titanium layer and an aluminum layer.

Figures 28, 29:
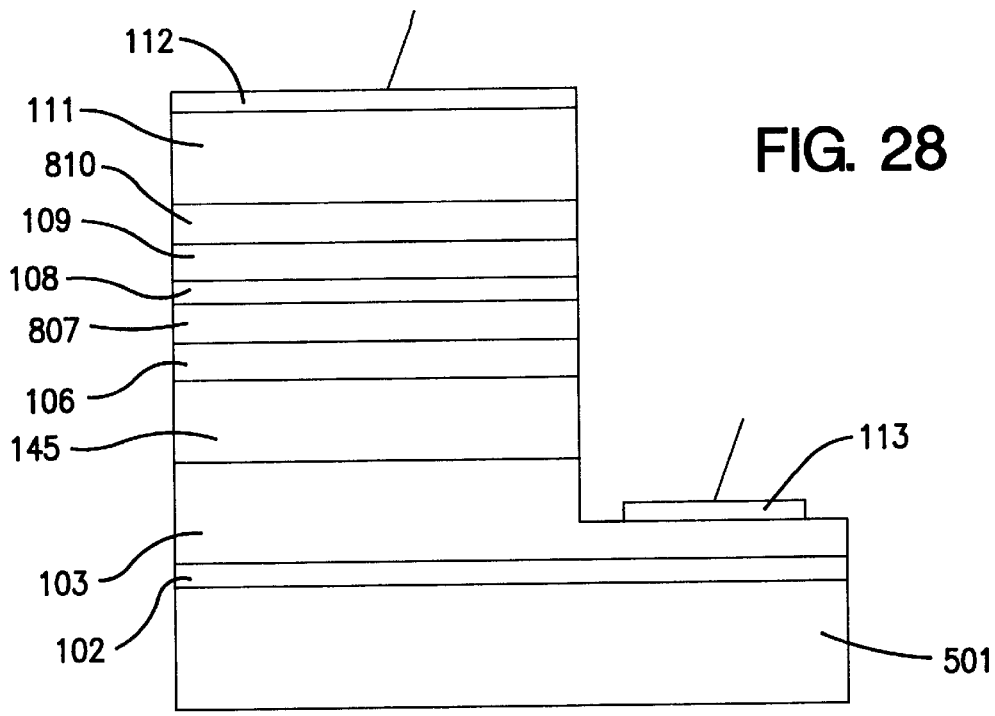
FIG. 28 which is a fragmentary cross sectional elevation view illustrative of a gallium nitride based semiconductor laser device in an eighth embodiment according to the present invention.
FIG. 29 is a diagram illustrative of a profile of an aluminum index "x" of the n-type $Al_{0.04}Ga_{0.96}N$ cladding layer 145 having a thickness of 1 μm in an eighth embodiment according to the present invention.

FIG. 29 is a diagram illustrative of a profile of an aluminum index "x" of the n-type $Al_{0.04}Ga_{0.96}N$ cladding layer 145 having a thickness of 1 μm. As shown in FIG. 29, the aluminum index "x" of the two n-type $Al_{0.04}Ga_{0.96}N$ layers is constant at 0.04 so that an averaged value of the aluminum index "x" of the two n-type $Al_{0.04}Ga_{0.96}N$ layers and the intermediate InGaN layer is in the range of not less than 0.01 to less than 0.05. Namely, the averaged value of the index "x" of aluminum of the above cladding layer is suppressed low values, for example, in the range of not less than 0.01 to less than 0.05, so as to suppress any crack to appear in the cladding layer. It is therefore unnecessary to provide any further InGaN layer having a large optical absorption loss for the propose of prevention of the crack in the cladding layer. No provision of any further layer having the large optical absorption loss allows a substantial reduction in a threshold current for laser emission.

The drop of the averaged value of the index "x" of aluminum of the above cladding layer makes the cladding layer decrease in optical confinement into the active region, whilst the increase in total thickness of the above cladding layer makes the cladding layer increase in optical confinement into the active region. The total thickness of the above cladding layer is 1.6 micrometer which is larger than 0.7 micrometers.

The above improved cladding layer 145 provides a sufficiently large optical confinement into the active region including the active layer 807 and the optical guide layer 106 without optical dispersion into the cladding layer 145 and the GaN contact layer 103.

Accordingly, the above improved cladding layer 145 is capable of not only providing a sufficiently large optical confinement into the active region but also avoiding the crack in the cladding layer 145.

NINTH EMBODIMENT

Figure 30:
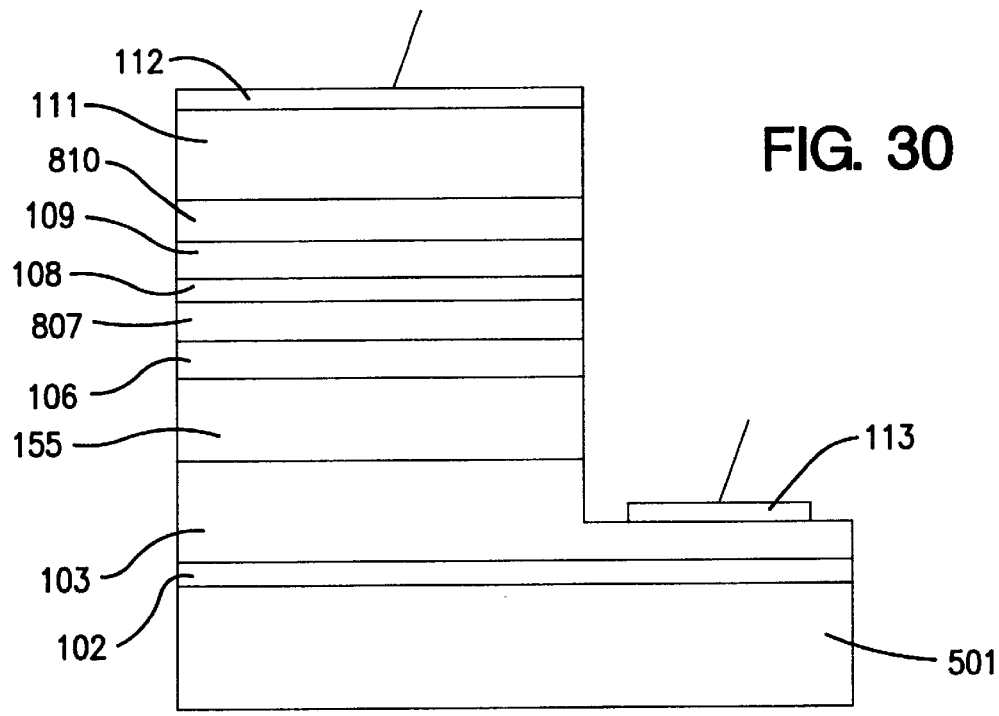
FIG. 30 which is a fragmentary cross sectional elevation view illustrative of a gallium nitride based semiconductor laser device in a ninth embodiment according to the present invention.

A ninth embodiment according to the present invention will be described in detail with reference to FIG. 30 which is a fragmentary cross sectional elevation view illustrative of a gallium nitride based semiconductor laser device. The gallium nitride based semiconductor laser device is formed on a (11-20)-face of a sapphire substrate 501. An undoped GaN buffer layer 102 is provided on the (11-20)-face of the sapphire substrate 501. The undoped GaN buffer layer 102 has a thickness of 500 Å. An n-type GaN contact layer 103 is provided on the undoped GaN buffer layer 102. The n-type GaN contact layer 103 is doped with Si. The n-type GaN contact layer 103 has a thickness of 1.5 µm. A cladding layer 155 is provided on the n-type GaN contact layer 103. The cladding layer 155 comprises alternating laminations of n-type $Al_{0.04}Ga_{0.96}N$ layers having a thickness of 10 nanometers and n-type GaN layers having a thickness of 10 nanometers. An aluminum index "x" of the n-type $Al_{0.04}Ga_{0.96}N$ layers is constant at 0.04 so that an averaged value of the aluminum index "x" of the n-type $Al_{0.04}Ga_{0.96}N$ layers and the n-type GaN layers is in the range of not less than 0.01 to less than 0.05. The cladding layer 155 is doped with Si. The cladding layer 155 has a total thickness of not less than 0.7 µm. An n-type GaN optical guide layer 106 is provided on the cladding layer 155. The n-type GaN optical guide layer 106 is doped with Si. The n-type GaN optical guide layer 106 has a thickness of 0.1 µm. A multiple quantum well active layer 807 is provided on the n-type GaN optical guide layer 106. The multiple quantum well active layer 807 comprises 7 periods of alternating laminations of undoped $In_{0.2}Ga_{0.8}N$ quantum well layers having a thickness of 25 Å and undoped $In_{0.05}Ga_{0.95}N$ barrier layers having a thickness of 50 Å. A p-type $Al_{0.2}Ga_{0.8}N$ layer 108 is provided on the multiple quantum well active layer 807. The p-type $Al_{0.2}Ga_{0.8}N$ layer 108 is doped with Mg. The p-type $Al_{0.2}Ga_{0.8}N$ layer 108 has a thickness of 200 Å. The p-type $Al_{0.2}Ga_{0.8}N$ layer 108 is capable of suppression of dissociation and evaporation of indium from the undoped $In_{0.2}Ga_{0.8}N$ quantum well layers or the undoped $In_{0.05}Ga_{0.95}N$ barrier layers. A p-type GaN optical guide layer 109 is provided on the p-type $Al_{0.2}Ga_{0.8}N$ layer 108. The p-type GaN optical guide layer 109 is doped with Mg. The p-type GaN optical guide layer 109 has a thickness of 0.1 µm. A p-type $Al_{0.07}Ga_{0.93}N$ cladding layer 810 is provided on the p-type GaN optical guide layer 109. The p-type $Al_{0.07}Ga_{0.93}N$ cladding layer 810 is doped with Mg. The p-type $Al_{0.07}Ga_{0.93}N$ cladding layer 810 has a thickness of 0.4 µm. A p-type GaN contact layer 111 is provided on the p-type $Al_{0.07}Ga_{0.93}N$ cladding layer 810. The p-type GaN contact layer 111 is doped with Mg. The p-type GaN contact layer 111 has a thickness of 0.2 µm. A p-electrode 112 is provided on the p-type GaN contact layer 111. The p-electrode 112 comprises laminations of a nickel layer and a gold layer. An n-electrode 113 is provided on a part of the n-type GaN contact layer 103. The n-electrode 113 comprises laminations of a titanium layer and an aluminum layer.

Figure 31:
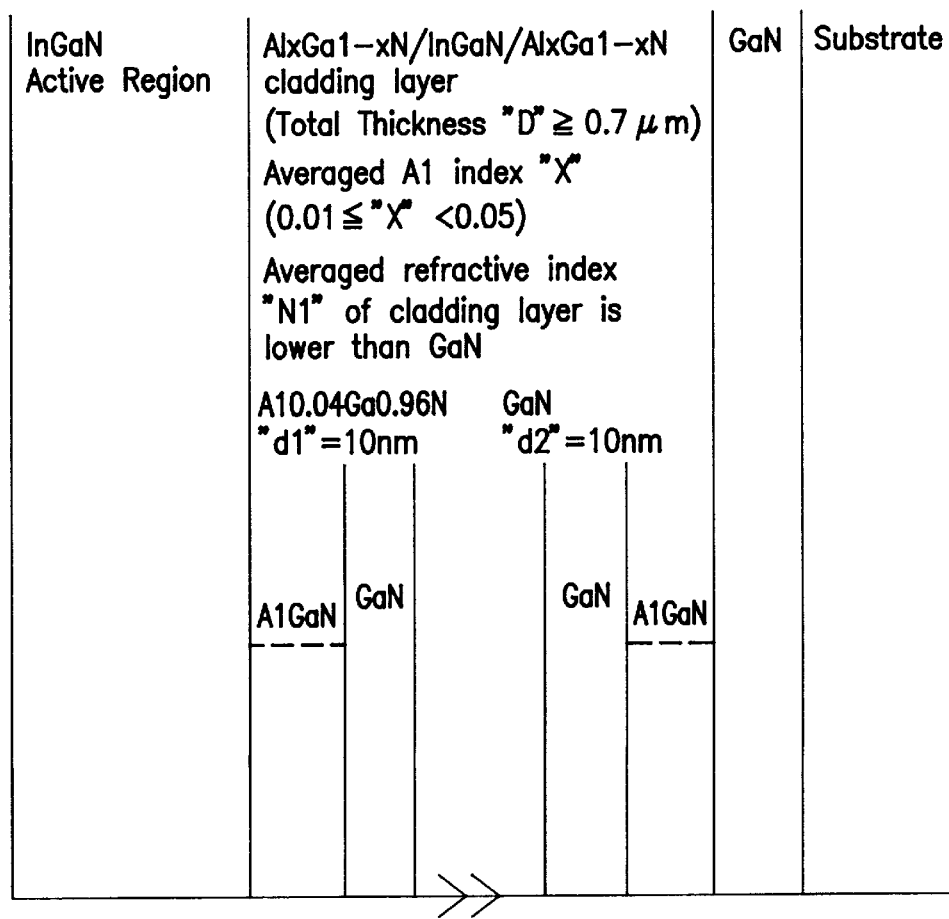
FIG. 31 is a diagram illustrative of a profile of an aluminum index "x" of the n-type $Al_{0.04}Ga_{0.96}N$ cladding layer 155 having a thickness of 1 μm in a ninth embodiment according to the present invention.

FIG. 31 is a diagram illustrative of a profile of an aluminum index "x" of the n-type $Al_{0.04}Ga_{0.96}N$ cladding layer 155 having a thickness of 1 µm. As shown in FIG. 31, An aluminum index "x" of the n-type $Al_{0.04}Ga_{0.96}N$ layers is constant at 0.04 so that an averaged value of the aluminum index "x" of the n-type $Al_{0.04}Ga_{0.96}N$ layers and the n-type GaN layers is in the range of not less than 0.01 to less than 0.05. Namely, the averaged value of the index "x" of aluminum of the above cladding layer is suppressed low values, for example, in the range of not less than 0.01 to less than 0.05, so as to suppress any crack to appear in the cladding layer. It is therefore unnecessary to provide any further InGaN layer having a large optical absorption loss for the propose of prevention of the crack in the cladding layer. No provision of any further layer having the large optical absorption loss allows a substantial reduction in a threshold current for laser emission.

The drop of the averaged value of the index "x" of aluminum of the above cladding layer makes the cladding layer decrease in optical confinement into the active region, whilst the increase in total thickness of the above cladding layer makes the cladding layer increase in optical confinement into the active region. The total thickness of the above cladding layer is 1.6 micrometer which is larger than 0.7 micrometers.

The above improved cladding layer 155 provides a sufficiently large optical confinement into the active region including the active layer 807 and the optical guide layer 106 without optical dispersion into the cladding layer 155 and the GaN contact layer 103.

Accordingly, the above improved cladding layer 155 is capable of not only providing a sufficiently large optical confinement into the active region but also avoiding the crack in the cladding layer 155.

As described above, the averaged value of the index "x" of aluminum of the above at least one $Al_xGa_{1-x}N$ layer is suppressed low values, for example, in the range of not less than 0.01 to less than 0.05, so as to suppress any crack to appear in the cladding layer. It is not necessary to provide an InGaN layer having a large optical absorption loss for the propose of prevention of the crack in the cladding layer. No provision of such layer having the large optical absorption loss allows a substantial reduction in a threshold current for laser emission.

The drop of the averaged value of the index "x" of aluminum of the above at least one $Al_xGa_{1-x}N$ layer makes the cladding layer decrease in optical confinement into the active region, whilst the increase in total thickness of the above at least one $Al_xGa_{1-x}N$ layer makes the cladding layer increase in optical confinement into the active region. The total thickness of the above at least one $Al_xGa_{1-x}N$ layer is not less than 0.7 micrometers.

The cladding layer may include any other layer than the above $Al_xGa_{1-x}N$ layer with the above low the aluminum index "x", provided that the cladding layer is required to have an averaged refractive index which is lower than the refractive index of gallium nitride for optical confinement into the gallium nitride based active region.

The above improved cladding layer is capable of not only providing a sufficiently large optical confinement into the active region but also avoiding the crack in the cladding layer. Those effects can effectively be exhibited when the substrate is made of a material having a low refractive index which is not larger than a refractive index of gallium nitride. If, contrary to the present invention, the substrate is made of a different material having a high refractive index which is higher than the refractive index of gallium nitride and having a high optical absorption coefficient, then there is no issue to be solved by the present invention.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A cladding layer provided between a gallium nitride based semiconductor active region and a substrate made of a material having a refraction index which is not lager than a refraction index of gallium nitride, said cladding layer including at least one $Al_xGa_{1-x}N$ layer, wherein an averaged value of said index "x" of aluminum of said at least one $Al_xGa_{1-x}N$ layer is in the range of not less than 0.01 to less than 0.05 and a total thickness of said at least one $Al_xGa_{1-x}N$ layer is not less than 0.7 micrometers as well as said cladding layer has an averaged refractive index which is lower than said refractive index of gallium nitride.

2. The cladding layer structure as claimed in claim 1, wherein said cladding layer comprises a single $Al_xGa_{1-x}N$ layer and said index "x" of aluminum of said single $Al_xGa_{1-x}N$ layer is constant at a value in the range of not less than 0.01 to less than 0.05.

3. The cladding layer structure as claimed in claim 2, wherein said cladding layer comprises a single $Al_xGa_{1-x}N$ layer and said index "x" of aluminum of said single $Al_xGa_{1-x}N$ layer is constant at a value in the range of not less than 0.01 to less than 0.03 and a thickness of said single $Al_xGa_{1-x}N$ layer is not less than 0.1 micrometer.

4. The cladding layer structure as claimed in claim 1, wherein said cladding layer comprises a single $Al_xGa_{1-x}N$ layer and said index "x" of aluminum of said single $Al_xGa_{1-x}N$ layer is continuously varied so that said averaged value of said index "x" is in the range of not less than 0.01 to less than 0.05.

5. The cladding layer structure as claimed in claim 4, wherein said index "x" of aluminum of said single $Al_xGa_{1-x}N$ layer is linearly varied so that said averaged value of said index "x" is in the range of not less than 0.01 to less than 0.05.

6. The cladding layer structure as claimed in claim 5, wherein said index "x" of aluminum of said single $Al_xGa_{1-x}N$ layer is varied to proportionally decrease in a thickness direction from said substrate to said active region.

7. The cladding layer structure as claimed in claim 4, wherein said index "x" of aluminum of said single $Al_xGa_{1-x}N$ layer is non-linearly varied so that said averaged value of said index "x" is in the range of not less than 0.01 to less than 0.05.

8. The cladding layer structure as claimed in claim 1, wherein said cladding layer comprises a single $Al_xGa_{1-x}N$ layer and said index "x" of aluminum of said single $Al_xGa_{1-x}N$ layer is discontinuously varied so that said averaged value of said index "x" is in the range of not less than 0.01 to less than 0.05.

9. The cladding layer structure as claimed in claim 8, wherein said cladding layer comprises a single $Al_xGa_{1-x}N$ layer and said index "x" of aluminum of said single $Al_xGa_{1-x}N$ layer is step-like varied so that said averaged value of said index "x" is in the range of not less than 0.01 to less than 0.05.

10. The cladding layer structure as claimed in claim 9, wherein said cladding layer comprises a single $Al_xGa_{1-x}N$ layer and said index "x" of aluminum of said single $Al_xGa_{1-x}N$ layer is step-like varied to discontinuously increase in a thickness direction from said substrate to said active region.

11. The cladding layer structure as claimed in claim 1, wherein said cladding layer comprises laminations of a plurality of $Al_xGa_{1-x}N$ layers, provided that an averaged value of said index "x" of aluminum of said plurality of $Al_xGa_{1-x}N$ layers is in the range of not less than 0.01 to less than 0.05 and a total thickness of said plurality of $Al_xGa_{1-x}N$ layers is not less than 0.7 micrometers.

12. The cladding layer structure as claimed in claim 11, wherein said plurality of $Al_xGa_{1-x}N$ layers differ in said index "x" from each other.

13. The cladding layer structure as claimed in claim 11, wherein each of said plurality of $Al_xGa_{1-x}N$ layers has a thickness less than 7 micrometers but a total thickness of said plurality of $Al_xGa_{1-x}N$ layers is not less than 7 micrometers.

14. The cladding layer structure as claimed in claim 11, wherein adjacent two of said $Al_xGa_{1-x}N$ layers are separated by an InGaN layer having a thickness of not larger than 300 nanometers so that an averaged value of said index "x" of aluminum of said cladding layer is in the range of not less than 0.01 to less than 0.05.

15. The cladding layer structure as claimed in claim 1, wherein said cladding layer comprises laminations of alternating $Al_xGa_{1-x}N$ layers and GaN layers so that a total thickness of said cladding layer is not less than 7 micrometers and said averaged value of said index "x" of aluminum in said cladding layer is in the range of not less than 0.01 to less than 0.05.

16. The cladding layer structure as claimed in claim 1, wherein said substrate comprises a sapphire substrate.

17. The cladding layer structure as claimed in claim 1, wherein said substrate comprises a spinel substrate.

18. The cladding layer structure as claimed in claim 1, wherein said substrate comprises a gallium nitride substrate.

19. The cladding layer structure as claimed in claim 1, wherein said gallium nitride based semiconductor active region comprises an indium gallium nitride active layer and an indium gallium nitride optical guide layer in contact with said indium gallium nitride active layer.

20. The cladding layer structure as claimed in claim 1, wherein a gallium nitride layer is further disposed between said substrate and said cladding layer and a thickness of said gallium nitride layer is not larger than 1.0 micrometer.

21. The cladding layer structure as claimed in claim 1, wherein said cladding layer is in contact directly with an electrode.

22. A gallium nitride based semiconductor multi-layer structure in a semiconductor laser device, comprising:

a substrate made of a material having a refraction index which is not lager than a refraction index of gallium nitride, a gallium nitride based semiconductor active region; and a cladding layer provided between said substrate and said active region, said cladding layer including at least one $Al_xGa_{1-x}N$ layer, wherein an averaged value of said index "x" of aluminum of said at least one $Al_xGa_{1-x}N$ layer is in the range of not less than 0.01 to less than 0.05 and a total thickness of said at least one $Al_xGa_{1-x}N$ layer is not less than 0.7 micrometers as well as said cladding layer has an averaged refractive index which is lower than said refractive index of gallium nitride.

23. The gallium nitride based semiconductor multi-layer structure as claimed in claim 22, wherein said cladding layer comprises a single $Al_xGa_{1-x}N$ layer and said index "x" of aluminum of said single $Al_xGa_{1-x}N$ layer is constant at a value in the range of not less than 0.01 to less than 0.05.

24. The gallium nitride based semiconductor multi-layer structure as claimed in claim 23, wherein said cladding layer comprises a single $Al_xGa_{1-x}N$ layer and said index "x" of aluminum of said single $Al_xGa_{1-x}N$ layer is constant at a value in the range of not less than 0.01 to less than 0.03 and a thickness of said single $Al_xGa_{1-x}N$ layer is not less than 0.1 micrometer.

25. The gallium nitride based semiconductor multi-layer structure as claimed in claim 22, wherein said cladding layer comprises a single $Al_xGa_{1-x}N$ layer and said index "x" of aluminum of said single $Al_xGa_{1-x}N$ layer is continuously varied so that said averaged value of said index "x" is in the range of not less than 0.01 to less than 0.05.

26. The gallium nitride based semiconductor multi-layer structure as claimed in claim 25, wherein said index "x" of aluminum of said single $Al_xGa_{1-x}N$ layer is linearly varied so that said averaged value of said index "x" is in the range of not less than 0.01 to less than 0.05.

27. The gallium nitride based semiconductor multi-layer structure as claimed in claim 26, wherein said index "x" of aluminum of said single $Al_xGa_{1-x}N$ layer is varied to proportionally decrease in a thickness direction from said substrate to said active region.

28. The gallium nitride based semiconductor multi-layer structure as claimed in claim 25, wherein said index "x" of aluminum of said single $Al_xGa_{1-x}N$ layer is non-linearly varied so that said averaged value of said index "x" is in the range of not less than 0.01 to less than 0.05.

29. The gallium nitride based semiconductor multi-layer structure as claimed in claim 22, wherein said cladding layer comprises a single $Al_xGa_{1-x}N$ layer and said index "x" of aluminum of said single $Al_xGa_{1-x}N$ layer is discontinuously varied so that said averaged value of said index "x" is in the range of not less than 0.01 to less than 0.05.

30. The gallium nitride based semiconductor multi-layer structure as claimed in claim 29, wherein said cladding layer comprises a single $Al_xGa_{1-x}N$ layer and said index "x" of aluminum of said single $Al_xGa_{1-x}N$ layer is step-like varied so that said averaged value of said index "x" is in the range of not less than 0.01 to less than 0.05.

31. The gallium nitride based semiconductor multi-layer structure as claimed in claim 30, wherein said cladding layer comprises a single $Al_xGa_{1-x}N$ layer and said index "x" of aluminum of said single $Al_xGa_{1-x}N$ layer is step-like varied to discontinuously increase in a thickness direction from said substrate to said active region.

32. The gallium nitride based semiconductor multi-layer structure as claimed in claim 22, wherein said cladding layer comprises laminations of a plurality of $Al_xGa_{1-x}N$ layers, provided that an averaged value of said index "x" of aluminum of said plurality of $Al_xGa_{1-x}N$ layers is in the range of not less than 0.01 to less than 0.05 and a total thickness of said plurality of $Al_xGa_{1-x}N$ layers is not less than 0.7 micrometers.

33. The gallium nitride based semiconductor multi-layer structure as claimed in claim 32, wherein said plurality of $Al_xGa_{1-x}N$ layers differ in said index "x" from each other.

34. The gallium nitride based semiconductor multi-layer structure as claimed in claim 32, wherein each of said plurality of $Al_xGa_{1-x}N$ layers has a thickness less than 7 micrometers but a total thickness of said plurality of $Al_xGa_{1-x}$ N layers is not less than 7 micrometers.

35. The gallium nitride based semiconductor multi-layer structure as claimed in claim 32, wherein adjacent two of said $Al_xGa_{1-x}N$ layers are separated by an InGaN layer having a thickness of not larger than 300 nanometers so that an averaged value of said index "x" of aluminum of said cladding layer is in the range of not less than 0.01 to less than 0.05.

36. The gallium nitride based semiconductor multi-layer structure as claimed in claim 22, wherein said cladding layer comprises laminations of alternating AlxGa1–xN layers and GaN layers so that a total thickness of said cladding layer is not less than 7 micrometers and said averaged value of said index "x" of aluminum in said cladding layer is in the range of not less than 0.01 to less than 0.05.

37. The gallium nitride based semiconductor multi-layer structure as claimed in claim 22, wherein said substrate comprises a sapphire substrate.

38. The gallium nitride based semiconductor multi-layer structure as claimed in claim 22, wherein said substrate comprises a spinel substrate.

39. The gallium nitride based semiconductor multi-layer structure as claimed in claim 22, wherein said substrate comprises a gallium nitride substrate.

40. The gallium nitride based semiconductor multi-layer structure as claimed in claim 22, wherein said gallium nitride based semiconductor active region comprises an indium gallium nitride active layer and an indium gallium nitride optical guide layer in contact with said indium gallium nitride active layer.

41. The gallium nitride based semiconductor multi-layer structure as claimed in claim 22, wherein a gallium nitride layer is further disposed between said substrate and said cladding layer and a thickness of said gallium nitride layer is not larger than 1.0 micrometer.

42. The gallium nitride based semiconductor multi-layer structure as claimed in claim 22, wherein said cladding layer is in contact directly with an electrode.

43. A gallium nitride based semiconductor laser device, comprising:

a substrate made of a material having a refraction index which is not lager than a refraction index of gallium nitride;

a first contact layer being made of gallium nitride and said first contact layer being provided over said substrate;

a first cladding layer provided over said first contact layer, and said cladding layer including at least one $Al_xGa_{1-x}$ N layer;

a gallium nitride based semiconductor active region provided over said cladding layer;

a second cladding layer provided over said gallium nitride based semiconductor active region;

a second contact layer provided over said second cladding layer;

a first electrode provided in contact with said first contact layer; and a second electrode provided in contact with said second contact layer;

wherein an averaged value of said index "x" of aluminum of said at least one $Al_xGa_{1-x}N$ layer is in the range of not less than 0.01 to less than 0.05 and a total thickness of said at least one $Al_xGa_{1-x}N$ layer is not less than 0.7 micrometers as well as said cladding layer has an averaged refractive index which is lower than said refractive index of gallium nitride.

44. The gallium nitride based semiconductor laser device as claimed in claim 43, wherein said cladding layer comprises a single $Al_xGa_{1-x}N$ layer and said index "x" of aluminum of said single $Al_xGa_{1-x}N$ layer is constant at a value in the range of not less than 0.01 to less than 0.05.

45. The gallium nitride based semiconductor laser device as claimed in claim 44, wherein said cladding layer comprises a single $Al_xGa_{1-x}N$ layer and said index "x" of aluminum of said single $Al_xGa_{1-x}N$ layer is constant at a value in the range of not less than 0.01 to less than 0.03 and a thickness of said single $Al_xGa_{1-x}N$ layer is not less than 0.1 micrometer.

46. The gallium nitride based semiconductor laser device as claimed in claim 43, wherein said cladding layer comprises a single $Al_xGa_{1-x}N$ layer and said index "x" of aluminum of said single $Al_xGa_{1-x}N$ layer is continuously varied so that said averaged value of said index "x" is in the range of not less than 0.01 to less than 0.05.

47. The gallium nitride based semiconductor laser device as claimed in claim 46, wherein said index "x" of aluminum of said single $Al_xGa_{1-x}N$ layer is linearly varied so that said averaged value of said index "x" is in the range of not less than 0.01 to less than 0.05.

48. The gallium nitride based semiconductor laser device as claimed in claim 47, wherein said index "x" of aluminum of said single $Al_xGa_{1-x}N$ layer is varied to proportionally decrease in a thickness direction from said substrate to said active region.

49. The gallium nitride based semiconductor laser device as claimed in claim 46, wherein said index "x" of aluminum of said single $Al_xGa_{1-x}N$ layer is non-linearly varied so that said averaged value of said index "x" is in the range of not less than 0.01 to less than 0.05.

50. The gallium nitride based semiconductor laser device as claimed in claim 43, wherein said cladding layer comprises a single $Al_xGa_{1-x}N$ layer and said index "x" of aluminum of said single $Al_xGa_{1-x}N$ layer is discontinuously varied so that said averaged value of said index "x" is in the range of not less than 0.01 to less than 0.05.

51. The gallium nitride based semiconductor laser device as claimed in claim 50, wherein said cladding layer comprise s a single $Al_xGa_{1-x}N$ layer and said index "x" of aluminum of said single $Al_xGa_{1-x}N$ layer is step-like varied so that said averaged value of said index "x" is in the range of not less than 0.01 to less th an 0.05.

52. The gallium nitride based semiconductor laser device as claimed in claim 51, wherein said cladding layer comprises a single $Al_xGa_{1-x}N$ layer and said index "x" of aluminum of said single $Al_xGa_{1-x}N$ layer is step-like varied to discontinuously increase in a thickness direction from said substrate to said active region.

53. The gallium nitride based semiconductor laser device as claimed in claim 43, wherein said cladding layer comprises laminations of a plurality of $Al_xGa_{1-x}N$ layers, provided that an averaged value of said index "x" of aluminum of said plurality of $Al_xGa_{1-x}N$ layers is in the range of not less than 0.01 to less than 0.05 and a total thickness of said plurality of $Al_xGa_{1-x}N$ layers is not less than 0.7 micrometers.

54. The gallium nitride based semiconductor laser device as claimed in claim 53, wherein said plurality of $Al_xGa_{1-x}N$ layers differ in said index "x" from each other.

55. The gallium nitride based semiconductor laser device as claimed in claim 53, wherein each of said plurality of $Al_xGa_{1-x}N$ layers has a thickness less than 7 micrometers but a total thickness of said plurality of $Al_xGa_{1-x}N$ layers is not less than 7 micrometers.

56. The gallium nitride based semiconductor laser device as claimed in claim 53, wherein adjacent two of said $Al_xGa_{1-x}N$ layers are separated by an InGaN layer having a thickness of not larger than 300 nanometers so that an averaged value of said index "x" of aluminum of said cladding layer is in the range of not less than 0.01 to less than 0.05.

57. The gallium nitride based semiconductor multi-layer structure as claimed in claim 43, wherein said cladding layer comprises laminations of alternating $Al_xGa_{1-x}N$ layers and GaN layers so that a total thickness of sad cladding layer is not less than 7 micrometers and said averaged value of said index "x" of aluminum in said cladding layer is in the range of not less than 0.01 to less than 0.05.

58. The gallium nitride based semiconductor laser device as claimed in claim 43, wherein said substrate comprises a sapphire substrate.

59. The gallium nitride based semiconductor laser device as claimed in claim 43, wherein said substrate comprises a spinel substrate.

60. The gallium nitride based semiconductor laser device as claimed in claim 43, wherein said substrate comprises a gallium nitride substrate.

61. The gallium nitride based semiconductor laser device as claimed in claim 43, wherein said gallium nitride based semiconductor active region comprises an indium gallium nitride active layer and an indium gallium nitride optical guide layer in contact with said indium gallium nitride active layer.

62. The gallium nitride based semiconductor laser device as claimed in claim 43, wherein a buffer layer is further disposed between said substrate and said first cladding layer.

63. The gallium nitride based semiconductor laser device as claimed in claim 43, wherein said first contact layer has a thickness of 0.5 micrometers.

64. A gallium nitride based semiconductor laser device, comprising:
a substrate made of a material having a refraction index which is not lager than a refraction index of gallium nitride;
a first contact layer being made of gallium nitride and said first contact layer being provided over said substrate;
a first cladding layer provided over said first contact layer, and said cladding layer including at least one $Al_xGa_{1-x}N$ layer;
a gallium nitride based semiconductor active region provided over said cladding layer;
a second cladding layer provided over said gallium nitride based semiconductor active region;
a second contact layer provided over said second cladding layer;
a first electrode provided in contact with said first cladding layer; and
a second electrode provided in contact with said second contact layer;
wherein an averaged value of said index "x" of aluminum of said at least one $Al_xGa_{1-x}N$ layer is in the range of not less than 0.01 to less than 0.05 and a total thickness of said at least one $Al_xGa_{1-x}N$ layer is not less than 0.7 micrometers as well as said cladding layer has an averaged refractive index which is lower than said refractive index of gallium nitride.

65. The gallium nitride based semiconductor laser device as claimed in claim 64, wherein said cladding layer comprises a single $Al_xGa_{1-x}N$ layer and said index "x" of aluminum of said single $Al_xGa_{1-x}N$ layer is constant at a value in the range of not less than 0.01 to less than 0.05.

66. The gallium nitride based semiconductor laser device as claimed in claim 65, wherein said cladding layer comprises a single $Al_xGa_{1-x}N$ layer and said index "x" of aluminum of said single $Al_xGa_{1-x}N$ layer is constant at a value in the range of not less than 0.01 to less than 0.03 and a thickness of said single $Al_xGa_{1-x}N$ layer is not less than 0.1 micrometer.

67. The gallium nitride based semiconductor laser device as claimed in claim 64, wherein said cladding layer comprises a single $Al_xGa_{1-x}N$ layer and said index "x" of aluminum of said single $Al_xGa_{1-x}N$ layer is continuously varied so that said averaged value of said index "x" is in the range of not less than 0.01 to less than 0.05.

68. The gallium nitride based semiconductor laser device as claimed in claim 67, wherein said index "x" of aluminum of said single $Al_xGa_{1-x}N$ layer is linearly varied so that said averaged value of said index "x" is in the range of not less than 0.01 to less than 0.05.

69. The gallium nitride based semiconductor laser device as claimed in claim 68, wherein said index "x" of aluminum of said single $Al_xGa_{1-x}N$ layer is varied to proportionally decrease in a thickness direction from said substrate to said active region.

70. The gallium nitride based semiconductor laser device as claimed in claim 67, wherein said index "x" of aluminum of said single $Al_xGa_{1-x}N$ layer is non-linearly varied so that said averaged value of said index "x" is in the range of not less than 0.01 to less than 0.05.

71. The gallium nitride based semiconductor laser device as claimed in claim 64, wherein said cladding layer comprises a single $Al_xGa_{1-x}N$ layer and said index "x" of aluminum of said single $Al_xGa_{1-x}N$ layer is discontinuously varied so that said averaged value of said index "x" is in the range of not less than 0.01 to less than 0.05.

72. The gallium nitride based semiconductor laser device as claimed in claim 71, wherein said cladding layer comprises a single $Al_xGa_{1-x}N$ layer and said index "x" of aluminum of said single $Al_xGa_{1-x}N$ layer is step-like varied so that said averaged value of said index "x" is in the range of not less than 0.01 to less than 0.05.

73. The gallium nitride based semiconductor laser device as claimed in claim 72, wherein said cladding layer comprises a single $Al_xGa_{1-x}N$ layer and said index "x" of aluminum of said single $Al_xGa_{1-x}N$ layer is step-like varied to discontinuously increase in a thickness direction from said substrate to said active region.

74. The gallium nitride based semiconductor laser device as claimed in claim 64, wherein said cladding layer comprises laminations of a plurality of $Al_xGa_{1-x}N$ layers, provided that an averaged value of said index "x" of aluminum of said plurality of $Al_xGa_{1-x}N$ layers is in the range of not less than 0.01 to less than 0.05 and a total thickness of said plurality of $Al_xGa_{1-x}N$ layers is not less than 0.7 micrometers.

75. The gallium nitride based semiconductor laser device as claimed in claim 74, wherein said plurality of $Al_xGa_{1-x}N$ layers differ in said index "x" from each other.

76. The gallium nitride based semiconductor laser device as claimed in claim 74, wherein each of said plurality of $Al_xGa_{1-x}N$ layers has a thickness less than 7 micrometers but a total thickness of said plurality of $Al_xGa_{1-x}N$ layers is not less than 7 micrometers.

77. The gallium nitride based semiconductor laser device as claimed in claim 74, wherein adjacent two of said $Al_xGa_{1-x}N$ layers are separated by an InGaN layer having a thickness of not larger than 300 nanometers so that an averaged value of said index "x" of aluminum of said cladding layer is in the range of not less than 0.01 to less than 0.05.

78. The gallium nitride based semiconductor multi-layer structure as claimed in claim 74, wherein said cladding layer comprises laminations of alternating $Al_xGa_{1-x}N$ layers and GaN layers so that a total thickness of said cladding layer is not less than 7 micrometers and said averaged value of said index "x" of aluminum in said cladding layer is in the range of not less than 0.01 to less than 0.05.

79. The gallium nitride based semiconductor laser device as claimed in claim 64, wherein said substrate comprises a sapphire substrate.

80. The gallium nitride based semiconductor laser device as claimed in claim 64, wherein said substrate comprises a spinel substrate.

81. The gallium nitride based semiconductor laser device as claimed in claim 64, wherein said substrate comprises a gallium nitride substrate.

82. The gallium nitride based semiconductor laser device as claimed in claim 64, wherein said gallium nitride based semiconductor active region comprises an indium gallium nitride active layer and an indium gallium nitride optical guide layer in contact with said indium gallium nitride active layer.

83. The gallium nitride based semiconductor laser device as claimed in claim 64, wherein a buffer layer is further disposed between said substrate and said first contact layer.

84. The gallium nitride based semiconductor laser device as claimed in claim 64, wherein said first contact layer has a thickness of 0.5 micrometers.

* * * * *